(12) United States Patent
Kwon

(10) Patent No.: US 11,569,137 B2
(45) Date of Patent: Jan. 31, 2023

(54) SEMICONDUCTOR PACKAGES

(71) Applicant: SAMSUNG ELECTRONICS CO., LTD., Suwon-si (KR)

(72) Inventor: Yonghwan Kwon, Yongin-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 90 days.

(21) Appl. No.: 17/245,628

(22) Filed: Apr. 30, 2021

(65) Prior Publication Data
US 2022/0068731 A1 Mar. 3, 2022

(30) Foreign Application Priority Data
Sep. 3, 2020 (KR) ........................ 10-2020-0112245

(51) Int. Cl.
*H01L 21/66* (2006.01)
*H01L 23/538* (2006.01)
(Continued)

(52) U.S. Cl.
CPC .......... *H01L 22/32* (2013.01); *H01L 21/4853* (2013.01); *H01L 21/4857* (2013.01); *H01L 21/565* (2013.01); *H01L 21/568* (2013.01); *H01L 21/6835* (2013.01); *H01L 22/12* (2013.01); *H01L 23/3128* (2013.01); *H01L 23/5383* (2013.01); *H01L 23/5386* (2013.01); *H01L 23/5389* (2013.01);
(Continued)

(58) Field of Classification Search
CPC . H01L 22/32; H01L 21/4853; H01L 21/4857; H01L 21/565; H01L 21/568; H01L 21/6835; H01L 22/12; H01L 23/3128; H01L 23/5383; H01L 23/5386; H01L 23/5389; H01L 24/19; H01L 24/20; H01L 2221/68372; H01L 2224/214
See application file for complete search history.

(56) References Cited

U.S. PATENT DOCUMENTS 6,008,542 A  12/1999 Takamori
7,064,450 B1  6/2006 Eghan et al.
(Continued)

FOREIGN PATENT DOCUMENTS

JP  2003060051 A  2/2003
JP  2009218264 A  9/2009

*Primary Examiner* — Fernando L Toledo
*Assistant Examiner* — Neil R Prasad
(74) *Attorney, Agent, or Firm* — Myers Bigel, P.A.

(57) ABSTRACT

A semiconductor package includes a semiconductor chip having first and second contact pads that are alternately arranged in a first direction; an insulating film having first openings respectively defining first pad regions of first contact pads, and second openings respectively defining second pad regions of the second contact pads; first and second conductive capping layers on the first and second pad regions, respectively; and an insulating layer on the insulating film, and having first and second contact holes respectively connected to the first and second conductive capping layers. Each of the first and second pad regions includes a bonding region having a first width and a probing region having a second width, greater than the first width, and each of the second pad regions is arranged in a direction that is opposite to each of the plurality of first pad regions.

20 Claims, 28 Drawing Sheets

(51) Int. Cl.
  *H01L 23/00*  (2006.01)
  *H01L 21/683*  (2006.01)
  *H01L 21/48*  (2006.01)
  *H01L 21/56*  (2006.01)
  *H01L 23/31*  (2006.01)

(52) U.S. Cl.
  CPC .............. *H01L 24/19* (2013.01); *H01L 24/20* (2013.01); *H01L 2221/68372* (2013.01); *H01L 2224/214* (2013.01)

(56) References Cited

U.S. PATENT DOCUMENTS

| | | | |
|---|---|---|---|
| 8,227,917 B2 | 7/2012 | Hsu et al. | |
| 8,456,024 B2 | 6/2013 | Ohnishi et al. | |
| 8,786,109 B2 | 7/2014 | Chi | |
| 10,566,255 B2 | 2/2020 | Akiba et al. | |
| 2005/0098903 A1* | 5/2005 | Yong | H01L 24/05 257/786 |
| 2009/0091032 A1* | 4/2009 | Hsu | H01L 22/32 257/E23.021 |
| 2010/0133535 A1* | 6/2010 | Ojiro | H01L 24/06 257/782 |
| 2013/0307143 A1 | 11/2013 | Lin et al. | |
| 2014/0361299 A1* | 12/2014 | Akiba | H01L 22/32 257/48 |
| 2015/0362526 A1 | 12/2015 | Wu et al. | |
| 2019/0295974 A1 | 9/2019 | Muraoka et al. | |

* cited by examiner

II-II'

SEMICONDUCTOR PACKAGES

CROSS-REFERENCE TO RELATED APPLICATION(S)

This application claims benefit of priority to Korean Patent Application No. 10-2020-0112245 filed on Sep. 3, 2020, in the Korean Intellectual Property Office, the disclosure of which is incorporated by reference herein in its entirety.

BACKGROUND

The present inventive concepts relate to semiconductor chips and semiconductor packages including the same.

As demands for high performance, high speed and/or multifunctionalization of semiconductor devices are increasing, a degree of integration of the semiconductor devices is increasing. In manufacturing a semiconductor chip corresponding to a trend of high integration of semiconductor devices, contact pads may be implemented that have a fine width or a fine pitch.

When such contact pads are assembled in a semiconductor package on which a semiconductor chip is mounted, they may be electrically connected to external terminals provided in the semiconductor package. Before assembly to form a semiconductor package, an electric signal may be applied to the contact pads using a probe to test whether or not they are operating normally.

SUMMARY

An aspect of the present inventive concepts is to provide a semiconductor package in which a problem of degraded reliability due to thermal shock is improved.

According to an aspect of the present inventive concepts, a semiconductor package includes: a semiconductor chip having an active surface on which a plurality of first contact pads and a plurality of second contact pads are alternately arranged in a first direction; an insulating film on the active surface of the semiconductor chip and having a plurality of first openings respectively defining first pad regions of the plurality of first contact pads and a plurality of second openings respectively defining second pad regions of the plurality of second contact pads; a plurality of first and second conductive capping layers on the first and second pad regions, respectively, each having an extension portion extending on the insulating film; an insulating layer on the insulating film and having a plurality of first and second contact holes respectively connected to the plurality of first and second conductive capping layers; and a redistribution layer on the insulating layer and respectively connected to the plurality of first and second conductive capping layers, through the plurality of first and second contact holes, wherein each of the first and second pad regions includes a bonding region having a first width and a probing region having a second width, greater than the first width, and each of the first pad regions is arranged in an order of the bonding region and the probing region in a second direction intersecting the first direction, and each of the second pad regions is arranged in an order of the bonding region and the probing region in a direction, opposite to the second direction.

According to an aspect of the present inventive concepts, a semiconductor package includes: a semiconductor chip having an active surface; and a redistribution structure on the active surface of the semiconductor chip, wherein the semiconductor chip includes a plurality of first contact pads and a plurality of second contact pads alternately arranged in a first direction on the active surface, an insulating film on the active surface of the semiconductor chip and having a plurality of first openings respectively defining first pad regions of the plurality of first contact pads and a plurality of second openings respectively defining second pad regions of the plurality of second contact pads, and a plurality of first and second conductive capping layers on the first and second pad regions, respectively, each of the first and second conductive capping layers having an extension portion extending on the insulating film, wherein the redistribution structure includes an insulating layer on the insulating film and a redistribution layer on the insulating layer, wherein the insulating layer includes a plurality of first and second contact holes respectively connected to the plurality of first and second conductive capping layers, wherein the redistribution layer is respectively connected to the plurality of first and second conductive capping layers through the plurality of first and second contact holes, wherein each of the first and second pad regions includes a bonding region having a first width, and a probing region having a second width, greater than the first width, wherein each of the first pad regions is arranged in an order of the bonding region and the probing region in a second direction, intersecting the first direction, and wherein each of the second pad regions is arranged in an order of the bonding region and the probing region in a direction, opposite to the second direction.

According to an aspect of the present inventive concepts, a semiconductor package includes: a semiconductor chip having an active surface on which a plurality of first contact pads and a plurality of second contact pads are alternately arranged in a first direction; an insulating film on the active surface of the semiconductor chip, and having a plurality of first and second openings having a shape respectively corresponding to the plurality of first and second contact pads; a plurality of first and second conductive capping layers on the plurality of first and second contact pads, respectively, each of the plurality of first and second conductive capping layers having an extension portion extending on the insulating film; an insulating layer on the insulating film and having a plurality of first and second contact holes respectively connected to the plurality of first and second conductive capping layers; and a redistribution layer on the insulating layer and respectively connected to the plurality of first and second conductive capping layers through the plurality of first and second contact holes, wherein each of the plurality of first and second contact pads includes a bonding region having a first width, and a probing region having a second width, greater than the first width, and each of the plurality of first and second contact pads is arranged such that the bonding region of the first contact pad is adjacent the probing region of the second contact pad and the bonding region of the second contact pad is adjacent the probing region of the first contact pad.

BRIEF DESCRIPTION OF DRAWINGS

The above and other aspects, features, and effects of the inventive concepts will be more clearly understood from the following detailed description, taken in conjunction with the accompanying drawings, in which.

DETAILED DESCRIPTION

Hereinafter, example embodiments of the inventive concepts will be described in detail with reference to the accompanying drawings.

Figure 1:
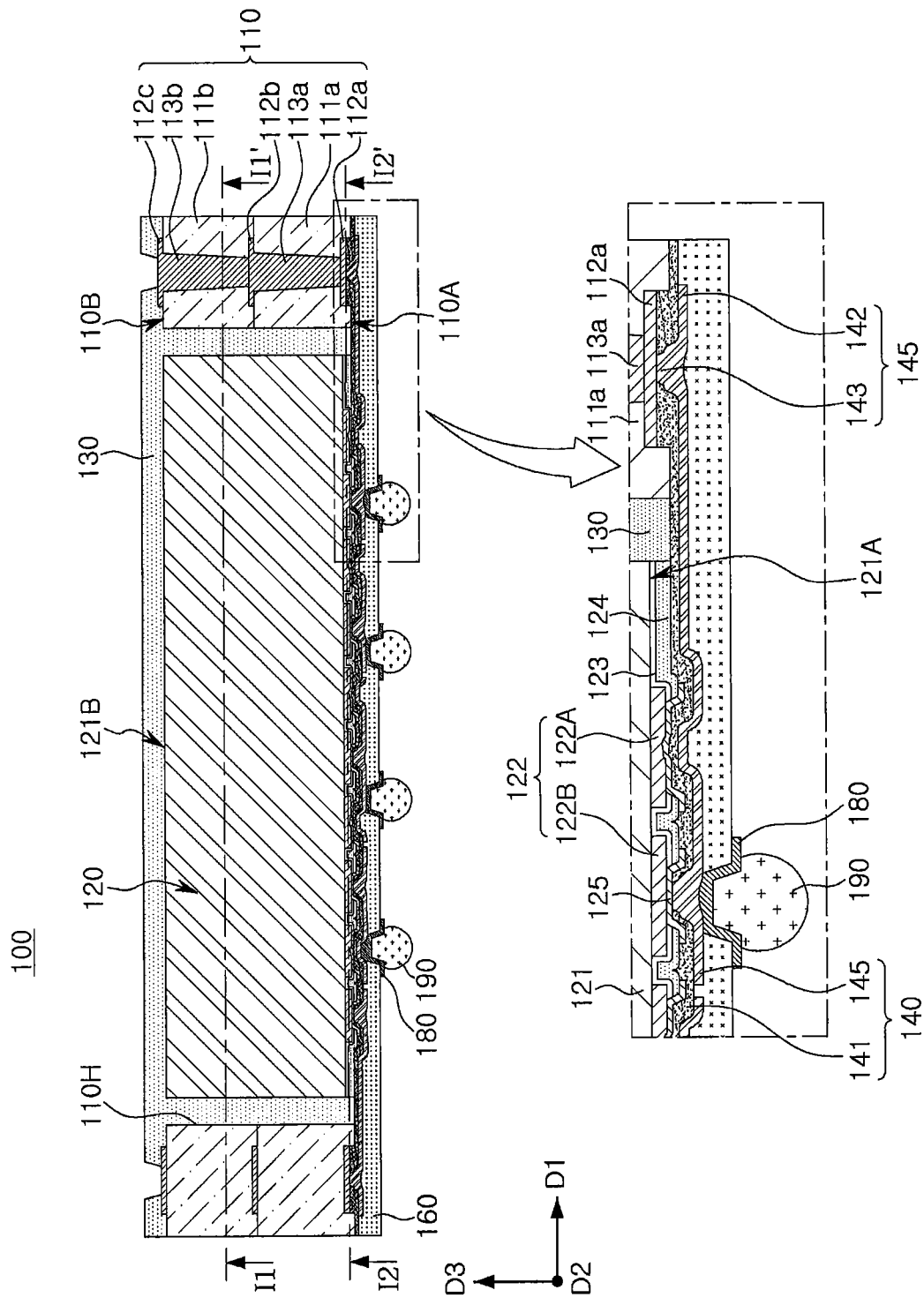
FIG. 1 is a schematic cross-sectional view illustrating a semiconductor package according to an example embodiment of the present inventive concepts.
Figure 2A:
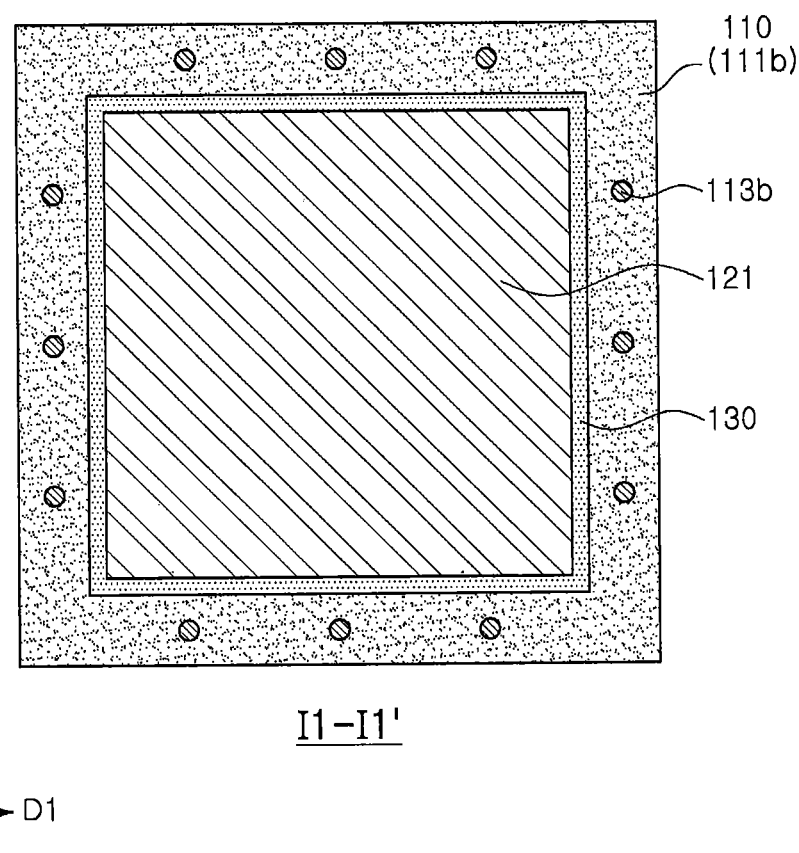
FIGS. 2A and 2B are plan views of the semiconductor package of FIG. 1 taken along lines I1-I1' and I2-I2', respectively.
Figure 2B:
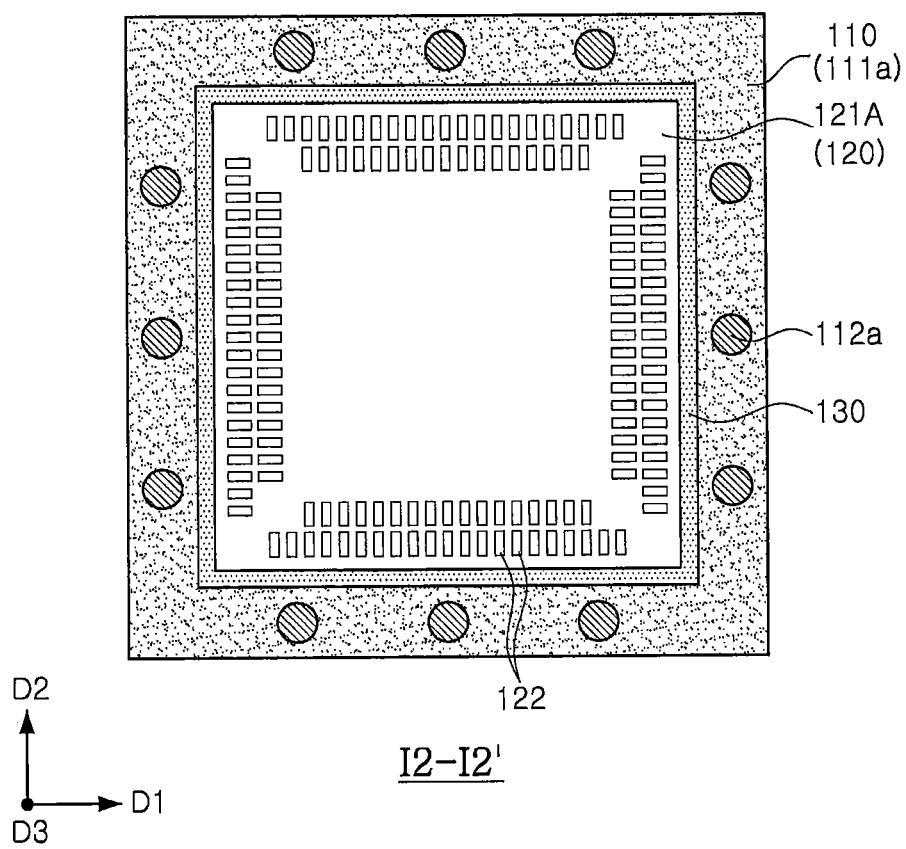
Figure 3:
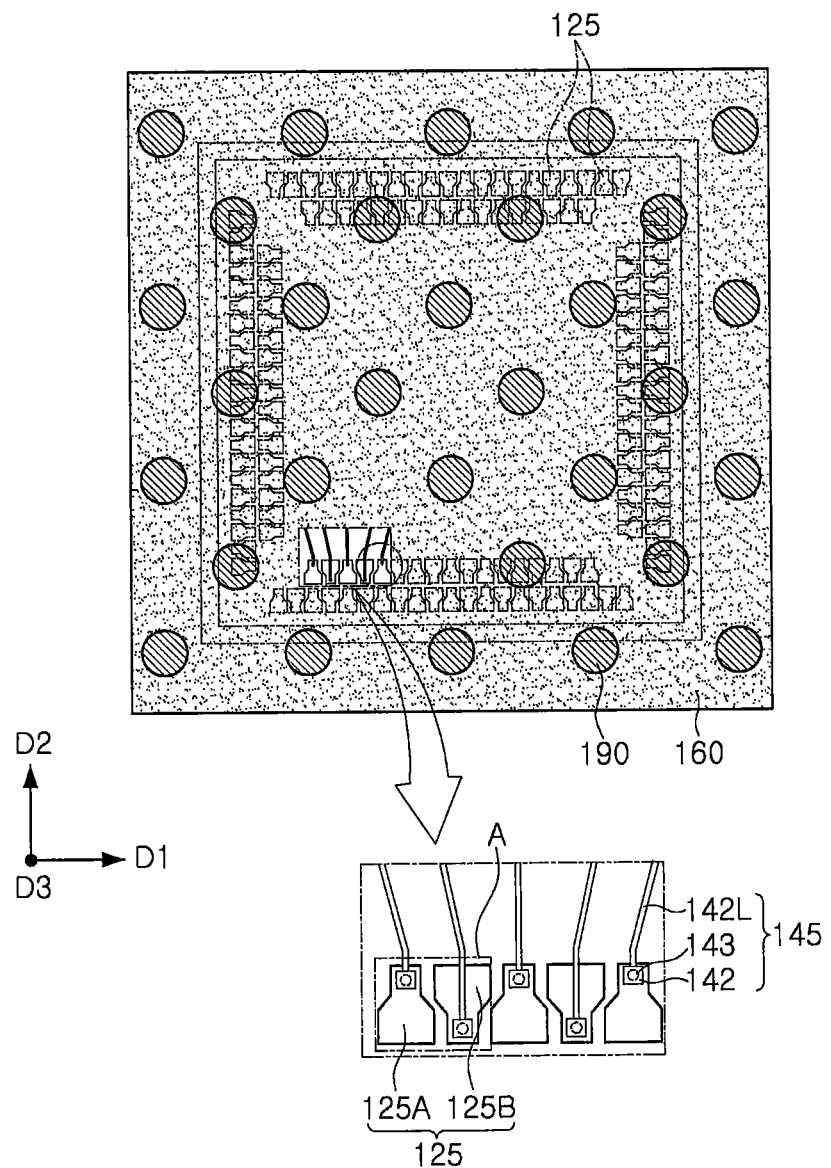
FIG. 3 is a bottom view illustrating the semiconductor package of FIG. 1.

FIG. 1 is a schematic cross-sectional view illustrating a semiconductor package 100 according to an example embodiment of the present inventive concepts, FIGS. 2A and 2B are plan views of the semiconductor package 100 of FIG. 1 taken along lines I1-I1' and I2-I2', respectively, and FIG. 3 is a bottom view illustrating the semiconductor package 100 of FIG. 1.

Referring to FIGS. 1, 2A, and 2B, a semiconductor package 100 according to the present example embodiment includes a support frame 110 having first and second surfaces 110A and 110B located opposite to each other, and having a cavity 110H, a semiconductor chip 120 disposed in the cavity 110H and having an active surface 121A on which a plurality of contact pads 122 are arranged, a redistribution structure 140 disposed on the first surface 110A of the support frame 110 and the active surface 121A of the semiconductor chip 120, and an encapsulant 130 for encapsulating the semiconductor chip 120 disposed in the cavity 110H. The redistribution structure 140 shown in FIGS. 2A and 2B may have an area larger than that of the semiconductor chip 120.

The semiconductor chip 120 may be manufactured from a semiconductor wafer. The semiconductor chip 120 may include a semiconductor substrate 121 such as, for example, silicon (Si), germanium (Ge), and gallium arsenide (GaAs).

The semiconductor chip 120 may be an integrated circuit IC having a plurality (e.g., tens to thousands) of contact pads 122. For example, the semiconductor chip 120 may include a microprocessor such as a central processor unit (CPU), a graphic processor unit, and/or an application processor (AP), a logic chip such as a field programmable gate array (FPGA) and an application-specific IC (ASIC), or a memory chip such as a volatile memory (e.g., DRAM), a non-volatile memory (e.g., ROM), and/or a flash memory.

The plurality of contact pads 122 may be arranged in various shapes (e.g., number, size, and/or pitch) on the active surface of the semiconductor chip 120. For example, the contact pads 122 may be arranged in one or more rows along four corners of the active surface, as shown in FIG. 2B. An example embodiment thereof is not limited thereto, and in some example embodiments, the contact pads 122 may be arranged over an entire region including a central region of the active surface.

The semiconductor chip 120 has an interconnection structure for connecting a redistribution layer 145 of the redistribution structure 140 and the plurality of contact pads 122. As shown in FIG. 1, this interconnection structure may include a passivation structure such as an insulating protective film 123 and an insulating film 124, and a plurality of conductive capping layers 125 respectively connected to a plurality of contact pads 122. The interconnection structure of the semiconductor chip 120 employed in the present example embodiment will be described in detail with reference to FIGS. 4A and 4B on the contact electrodes 122 arranged at a fine pitch.

Figure 4A:
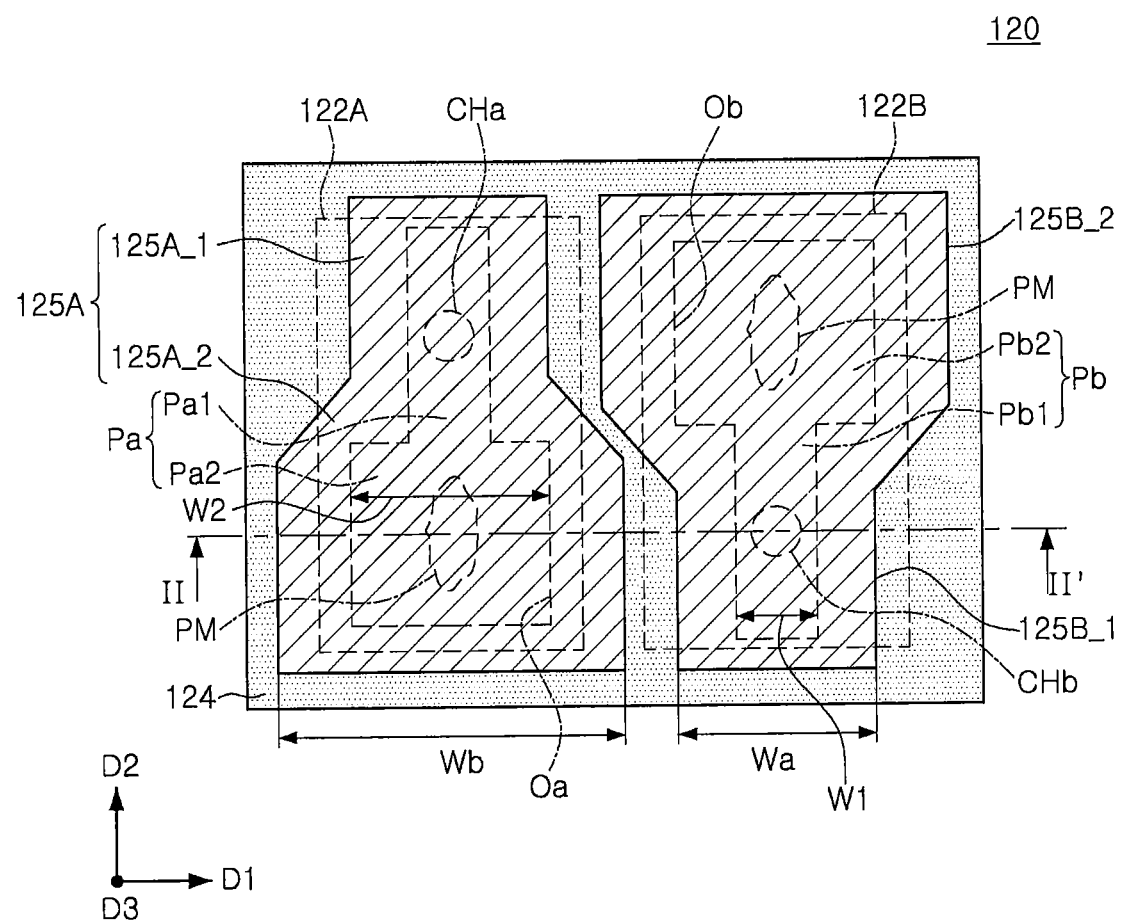
FIG. 4A is an enlarged view of part A (before a redistribution structure is applied) of the semiconductor package of FIG. 3.
Figure 4B:
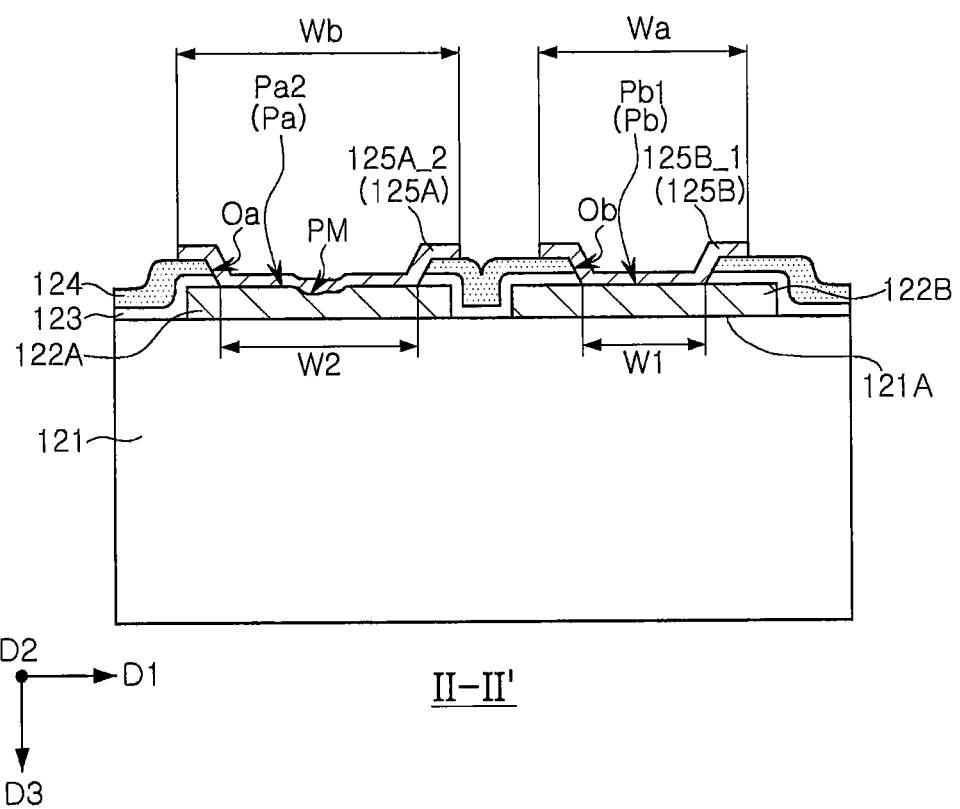
FIG. 4B is a cross-sectional view taken along line II-II' of the enlarged portion of FIG. 4A.

FIG. 4A is an enlarged view illustrating part A (a redistribution structure is omitted) of the semiconductor package 100 of FIG. 3, and FIG. 4B is a cross-sectional view taken along line II-II' of the enlarged portion of FIG. 4A.

Referring to FIGS. 4A and 4B, the semiconductor chip 120 according to the present example embodiment may include a semiconductor substrate 121, first and second contact pads 122A arranged on an active surface 121A of the semiconductor substrate 121, and an insulating protective film 123 and an insulating film 124 sequentially disposed on the active surface 121A. It will be understood that, although the terms first, second, third, etc. may be used herein to describe various elements, the elements should not be limited by these terms; rather, these terms are only used to distinguish one element from another element. Thus, a first element discussed could be termed a second element without departing from the scope of the present inventive concepts.

As shown in FIG. 2B, respective pluralities of the first and second contact pads 122A and 122B may be provided, and may be alternately arranged in a first direction (e.g., DD. For example, each of the first and second contact pads 122A and 122B may have the same square shape. As shown in FIG. 4A, each of the first and second contact pads 122A and 122B may have a rectangular shape extending in a second direction (e.g., D2) intersecting the first direction (e.g., DD.

For example, the first and second contact pads 122A and 122B may include metal such as aluminum (Al). The insulating protective film 123 may be disposed on the semiconductor substrate 121 and may include, for example, at least one material selected from an oxide, a nitride, and an oxynitride. In a specific example, the insulating protective film 123 may be $SiO_2/SiN$. The insulating film 124 may include an organic material, and in particular, may be a photosensitive organic material. For example, the insulating film 124 may include photosensitive polyimide (PSPI).

In the present example embodiment, the insulating protective film 123 and the insulating film 124 may have first and second openings Oa and Ob. The first and second openings Oa and Ob may define a first pad region Pa of the first contact pad 122A and a second pad region Pb of the second contact pad 122B, respectively.

Each of the first and second pad regions Pa and Pb may include bonding regions Pa1 and Pb1 having a first width W1 and probing regions Pa2 and Pb2 having a second width W2, wider than the first width W1. In other words, the first and second pad regions Pa and Pb may each have a hammer shape, and it can be understood that the probing regions Pa2 and Pb2 may have a relatively large area corresponding to a head region of the hammer shape.

The adjacent first and second pad regions Pa and Pb may be inversely arranged. Specifically, the first pad region Pa may be disposed in order of a bonding region Pa1 and a probing region Pa2 in a second direction (e.g., D2) intersecting the first direction (e.g., D1), and the second pad region Pb may be disposed in order of a bonding region Pb1 and a probing region Pb2 in a direction (e.g., -D2), opposite to the second direction (e.g., D2). For example, in some embodiments, the bonding region Pa1 of the first pad region Pa may be adjacent (e.g., in the first direction D1) the probing region Pb2 of the second pad region Pb and the probing region Pa2 of the first pad region Pa may be adjacent (e.g., in the first direction D1) the bonding region Pb1 of the second pad region Pb.

As described above, the plurality of contact pads 122 shown in FIG. 2B may have a rectangular shape, and as shown in FIG. 4A, adjacent first and second openings Oa and Ob may be hammer-shaped and may be inversely arranged. In addition, in this embodiment, the first and second openings Oa and Ob may be arranged such that bonding regions Pa1 and Pb1 and probing regions Pb2 and Pa2 face each other in a first direction (e.g., D1) from adjacent first and second pad regions Pa and Pb.

Each of the first and second contact pads 122A and 122B may have a probing mark PM disposed in probing regions Pa2 and Pb2. By introducing the probing regions Pa2 and Pb2 having a relatively large width W2, a probe needle may stably contact the contact pads 122. Here, the probing mark PM may be a concave mark generated in a process of contacting the contact pads 122A and 122B using a probe for testing. For example, the probe needle may include a high-hardness metal such as tungsten W, and since a fore-end is an end, the mark of the probe needle may be formed in a surface of the contact pads 122A and 122B such as in a probe inspection process, discussed herein, for example, with respect to FIGS. 9A and 9B.

The first and second conductive capping layers 125A and 125B may be disposed on the first and second pad regions Pa and Pb, respectively. Each of the first and second conductive capping layers 125A and 125B may include first regions 125A_1 and 125B_1 having a third width Wa, wider than the first width W1, and second regions 125A_2 and 125B_2 having a fourth width Wb, wider than the third width Wa. Similar to the shape and the arrangement of the first and second pad regions Pa and Pb, the first and second conductive capping layers 125A and 125B may have an inversely-arranged hammer shape. The first conductive capping layer 125A may be disposed in order of the first region 125A_1 and the second region 125A_2 in a second direction (e.g., D2), and in the second conductive capping layer 125B may be disposed in order of the first region 125B_1 and the second region 125B_2 in a direction (-D2), opposite to the second direction (e.g., D2). For example, in some embodiments, the first region 125A_1 of the first conductive capping layer 125A may be adjacent (e.g., in the first direction D1) the second region 125B_2 of the second conductive capping layer 125B and the second region 125A_2 of the first conductive capping layer 125A may be adjacent (e.g., in the first direction D1) the first region 125B_1 of the second conductive capping layer 125B.

The first and second conducive capping layers 125A and 125B may be compactly arranged. As shown in FIG. 4A, the second regions 125A_2 and 125B_2 of the adjacent first and second conductive capping layers 125A and 125B may have portions overlapping each other in the second direction D2.

Each of the first and second conductive capping layers 125A and 125B may have an extension portion extending on the insulating film. A length of the extension portion may be in a range from 5 µm to 30 µm in the first direction (e.g., D1). The lengths of portions extending from the first regions 125A_1 and 125B_1 and the second regions 125A_2 and 125B_2 may be substantially the same. For example, the third width Wa of the first regions 125A_1 and 125B_1 may be about 5 µm to 30 µm larger than the first width W1 of the bonding regions Pa1 and Pb1. Similarly thereto, the fourth width Wb of the second regions 125A_2 and 125B_2 may be about 5 µm to 30 µm larger than the second width W2 of the probing regions Pa2 and Pb2.

Figure 13A:
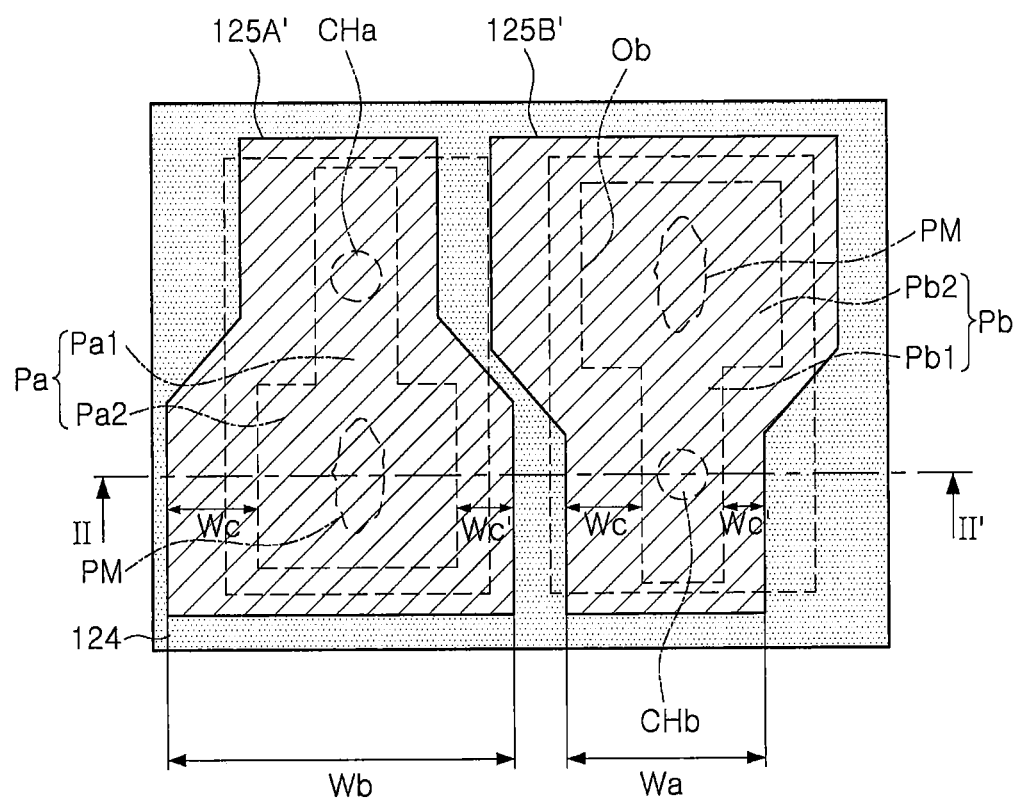
FIGS. 13A and 13B are schematic plan and cross-sectional views, respectively, illustrating a semiconductor chip employable in a semiconductor package according to an example embodiment of the present inventive concepts.
Figure 13B:
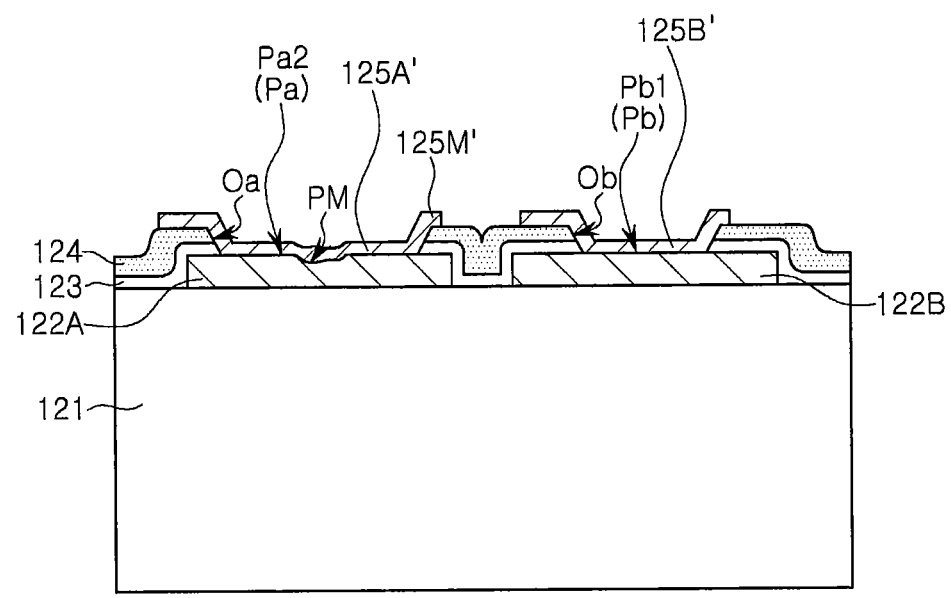

Such an extended portion may compensate for an error due to misalignment between a photoresist pattern for the first and second conductive capping layers 125A and 125B and the first and second openings Oa and Ob (see, e.g., FIGS. 13A and 13B). In some embodiments, widths of the extension portions of the first and second conductive capping layers 125A and 125B may be in a range of 3 µm to 20 µm, respectively.

The insulating protective film 123 and the insulating film 124 and the first and second conductive capping layers 125 may be provided in a wafer level process for manufacturing the semiconductor chip 120 (see, e.g., FIGS. 6A to 10B), and then it may be singulated on a chip level.

As shown in FIGS. 1 and 3, the conductive capping layer 125 may be connected to a redistribution layer 145 of the redistribution structure 140 (in particular, the redistribution via 143). The redistribution structure 140 may redistribute the contact pad 122 of the semiconductor chip 120. The redistribution structure 140 may be formed at a package level after being singulated to form a semiconductor chip (see, e.g., FIGS. 12A to 12D).

Figure 5A:
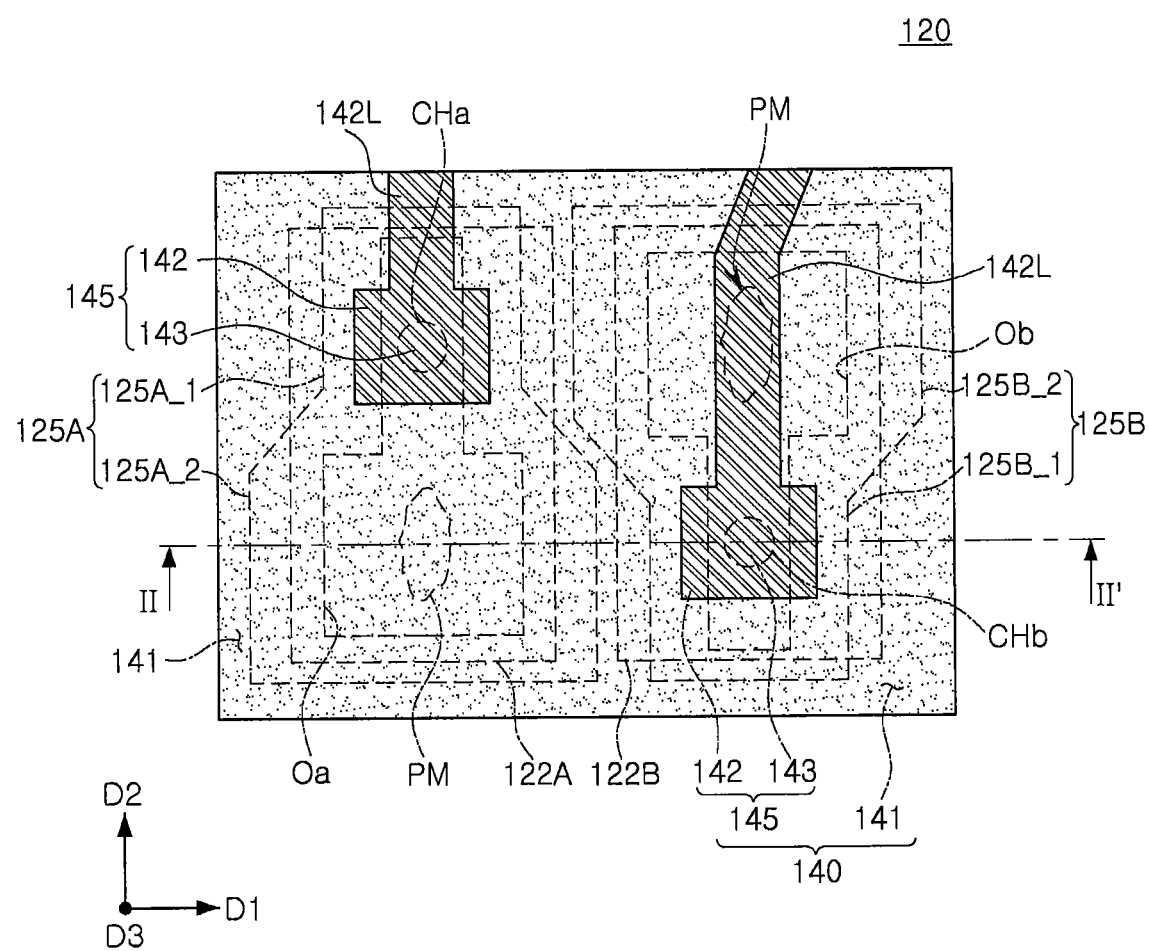
FIG. 5A is an enlarged view of part A (after a redistribution structure is applied) of the semiconductor package of FIG. 3.
Figure 5B:
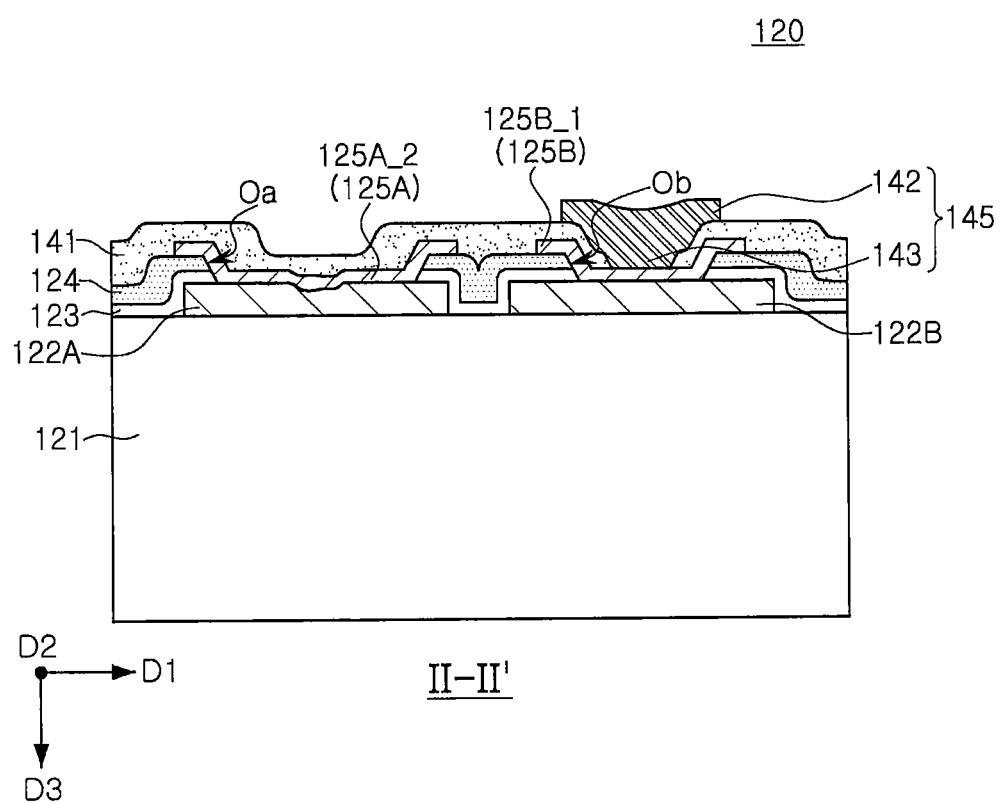
FIG. 5B is a cross-sectional view of the enlarged portion of FIG. 5A taken along line II-II'.

FIG. 5A is an enlarged view of part A (after a redistribution structure is applied) of the semiconductor package 100 of FIG. 3, and FIG. 5B is a cross-sectional view of the enlarged portion of FIG. 5A taken along line II-II'.

The redistribution structure 140 includes an insulating layer 141 disposed on the insulating film 124 to be on and/or cover the first and second conductive capping layers 125A and 125B, and a redistribution layer 145 disposed on the insulating layer 141. The insulating layer 141 includes first and second contact holes CHa and CHb respectively connected to the first and second conductive capping layers 125A and 125B. The redistribution layer 145 may include a redistribution pattern 142 disposed on the insulating layer 141, and redistribution vias 143 respectively connected to the first and second conductive capping layers 125A and 125B though the first and second contact holes CHa and CHb. The redistribution pattern 142 may include a redistribution line 142L.

The first and second contact holes CHa and CHb may be located in the first regions 125A_1 and 125B_1 of the first and second conductive capping layers 125A and 125B, respectively. A region disposed on the probe mark PM in the first and second conductive capping layers 125A and 125B may have a non-flat surface. Since the redistribution via 143 is formed in the first regions 125A_1 and 125B_1 in which the probe mark PM is not located, contact failure due to the probe mark PM can be prevented. In some example embodiments, the first and second contact holes CHa and CHb may be located in a region overlapping the bonding regions Pa1 and Pb1 in the first and second conductive capping layers 125A and 125B, respectively. The redistribution via 143 may be stably formed in a flat region.

The redistribution structure 140 may be formed using a photolithography process. For example, the insulating layer 141 may include a Photo Imagable Dielectric (PID) material. The redistribution layer 145 may be formed through a plating process using a seed layer. In this case, the redistribution pattern 142 may have a finer pattern (e.g., a relatively small thickness and/or line width) than other patterns (e.g., first to third wiring patterns 112a, 112b, and 112c described further herein) using a printed circuit board process. For example, the redistribution layer 145 may include copper (Cu), aluminum (Al), silver (Ag), tin (Sn), gold (Au), nickel (Ni), lead (Pb), titanium (Ti), or alloys thereof.

As described above, the contact pad 122 of the semiconductor chip 120 may be redistributed by the redistribution layer 145 of the redistribution structure 140, and may be electrically connected to an external device (e.g., a motherboard) through an electrical connection structure 190. The redistribution layer 145 of the redistribution structure 140 may not only be connected to the first and second conductive capping layers 125A and 125B of the semiconductor chip 120, but also to a wiring structure of the support frame 110 (e.g., a first wiring pattern 112a).

In the present embodiment, the support frame 110 may be a structure for maintaining rigidity of the semiconductor package 100. The support frame 110 includes a wiring structure connecting the first surface 110A and the second surface 110B, and may be electrically connected to the semiconductor chip 120 through the redistribution layer 145.

Referring back to FIGS. 1 to 3, the wiring structure of the support frame 110 may include a plurality of wiring patterns 112a, 112b, and 112c and a plurality of wiring vias 113a and 113b. For example, the wiring structure of the support frame 110 may include a first insulating layer 111a, a first wiring pattern 112a connected to the redistribution layer 145 of the redistribution structure 140 and within the first insulating layer 111a, a second wiring pattern 112b disposed on an opposite side of the first insulating layer 111a from the first wiring pattern 112a (e.g., at least a portion of the first insulating layer 111a is between the first wiring pattern 112a and the second wiring pattern 112b), a second insulating layer 111b disposed on the first insulating layer 111a and on/covering the second wiring pattern 112b, and a third wiring pattern 112c disposed on the second insulating layer 111b. The first wiring via 113a may penetrate through the first insulating layer 111a to be electrically connected to the first wiring patterns 112a and 111b. The second wiring via 113b may penetrate through the second insulating layer 111b to be electrically connected to the second and third wiring patterns 112b and 112c.

In the present embodiment, the first wiring pattern 112a may be recessed into the first insulating layer 111a. Due to the recessed step, it may be possible to prevent and/or reduce contamination of the first wiring pattern 112a due to a resin for forming an encapsulant 130 in a process of forming the encapsulant 130 (see FIG. 11B).

For the first and second insulating layers 111a and 111b, an insulating resin mixed with a reinforcing material such as inorganic filler (e.g., silica, alumina) or glass fiber may be used. For example, the first and second insulating layers 111a and 111b may include an Ajinomoto Build-up Film (ABF), FR-4, Bismaleimide Triazine (BT), or a prepreg. The wiring structure may include, for example, a conductive material such as copper (Cu), aluminum (Al), silver (Ag), tin (Sn), gold (Au), nickel (Ni), lead (Pb), titanium (Ti), or alloys thereof.

In some embodiments, the semiconductor package 100 may be implemented as a package-on-package (POP) using such a wiring structure. The support frame 110 may include a cavity 110H for accommodating the semiconductor chip 120.

The encapsulant 130 may protect the semiconductor chip 120. The encapsulant 130 may be on and/or cover the second surface 110B of the support frame 110 and the inactive surface 121B of the semiconductor chip 120, and may fill at least a portion of a sidewall of the cavity 110H and a side surface of the semiconductor chip 120. For example, the encapsulant 130 may include a resin such as an ABF or an epoxy molding compound (EMC).

A passivation layer 160 as a component for protecting the redistribution structure 140 from external physical and chemical damages may be provided. For example, the passivation layer 160 may include a photosensitive insulating material such as a photosensitive insulating resin, ABF or solder resist. The passivation layer 160 has a plurality of openings exposing a portion of the redistribution layer 145. An under bump metallurgy (UBM) layer 180 may be disposed in the opening of the passivation layer 160 and may be connected to the redistribution layer 145, and may form an electrical connection structure 190 on the UBM layer 180 and may be connected to an external circuit such as a mother board, or the like. The electrical connection structure 190 is used as a connection terminal for physically and/or electrically connecting the semiconductor package 100 externally. The electrical connection structure 190 may include a conductive material of, for example, a low-melting point alloy such as Sn—Al—Cu.

As shown in FIGS. 1 to 3, the redistribution structure 140 may have an area larger than that of the semiconductor chip 120. The redistribution structure 140 may have a fan-out region not overlapping with the semiconductor chip 120, and at least one of the electrical connection structures 190 may be disposed in the fan-out region.

Figure 6:
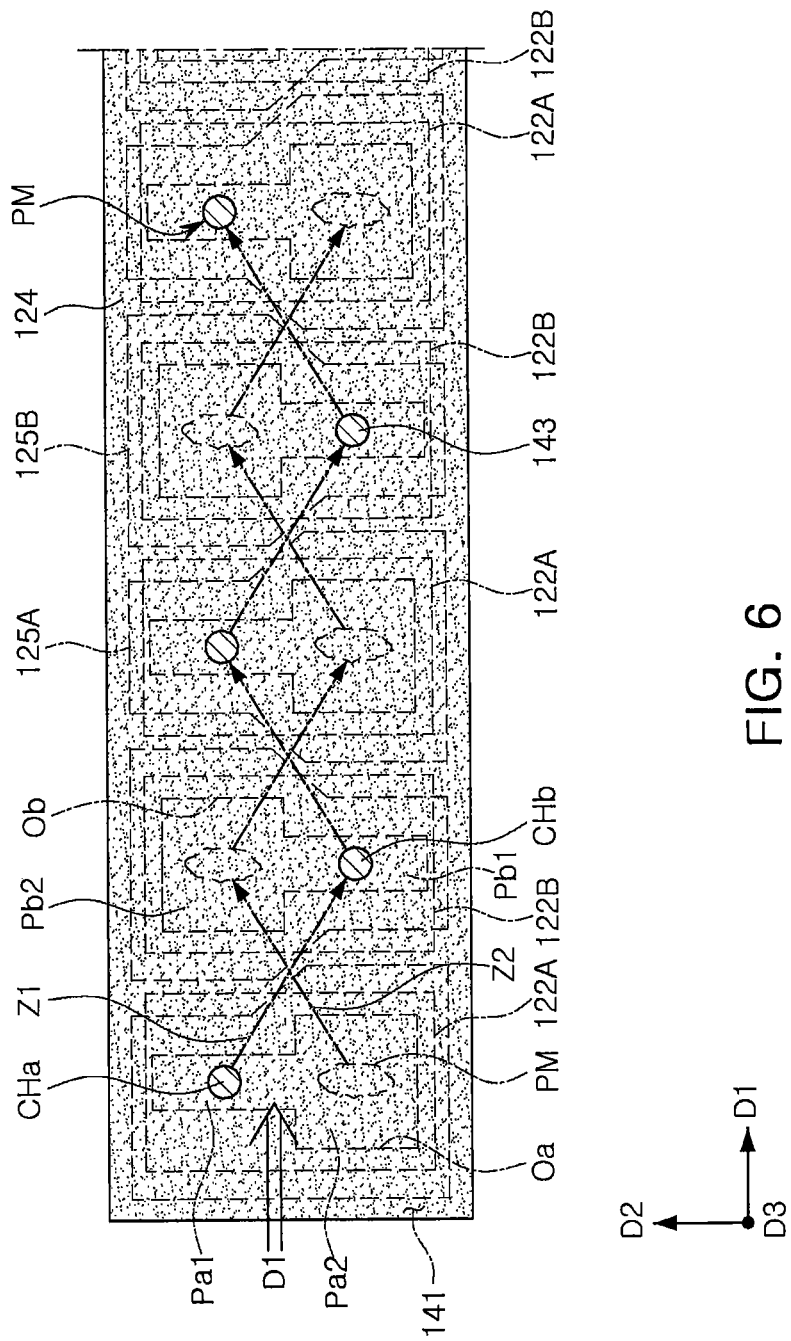
FIG. 6 is a plan view illustrating an array of conductive cap layers employed in an example embodiment of the present inventive concepts.

FIG. 6 is a plan view illustrating an array of conductive capping layers employed in an example embodiment of the present inventive concepts.

Referring to FIG. 6, an example group of the first and second conductive capping layers 125A and 125B illustrated in FIG. 5A are alternately arranged. The illustration of FIG. 6 may be understood as a partial region of the array of the first and second conductive capping layers 125A and 125B illustrated in FIG. 4A.

As described above, an insulating film 124 is disposed on the first and second contact pads 125A and 125B, and first and second pad regions Pa and Pb having a hammer shape may be provided through first and second openings Oa and Ob of the insulating film 124. The first and second pad regions Pa and Pb may be arranged such that adjacent pad regions are inversely arranged with each other. Similarly thereto, the first and second conductive capping layers 125A and 125B may be similarly provided in an inversely arranged hammer shape.

The position of the redistribution via 143 connected to the first and second conductive capping layers 125A and 125B through first and second contact holes CHa and CHb may be formed in a region overlapping with the bonding regions Pa1 and Pb1 other than the probing regions Pa2 and Pb2. Accordingly, contact failure of the redistribution via 143 due to the probe mark PM can be prevented.

As described above, when viewed in the direction in which the first and second contact pads 122A and 122B are arranged (e.g., D1), the position of the redistribution via 143 may also be arranged in a zigzag form Z1. Similarly thereto, the probe marks PM may also be arranged in a zigzag form Z2.

Figure 7A:
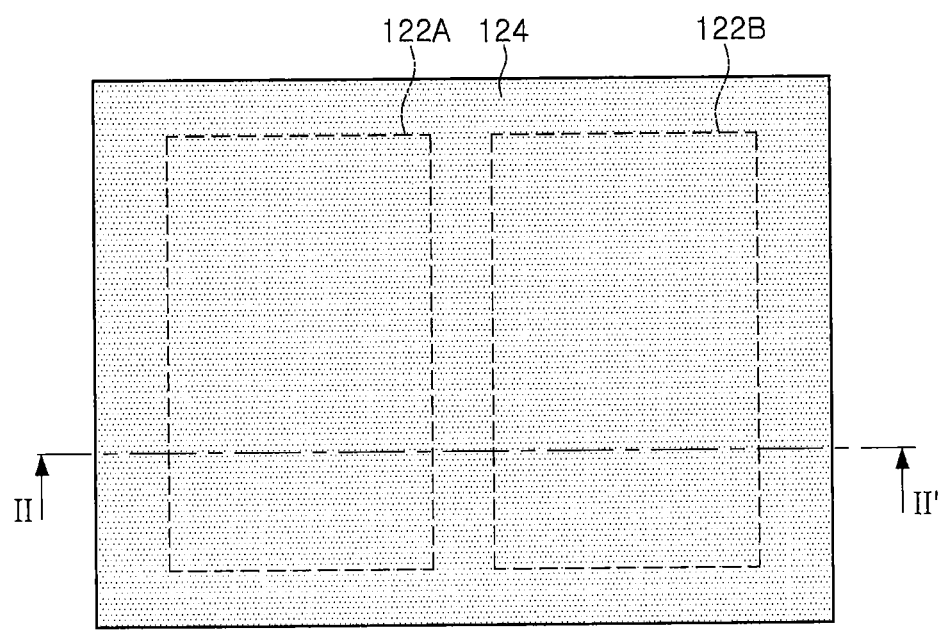
FIGS. 7A, 8A, 9A, and 10A are plan views illustrating a process of manufacturing an interconnection structure of a semiconductor chip according to an example embodiment of the present inventive concepts.
Figure 7B:
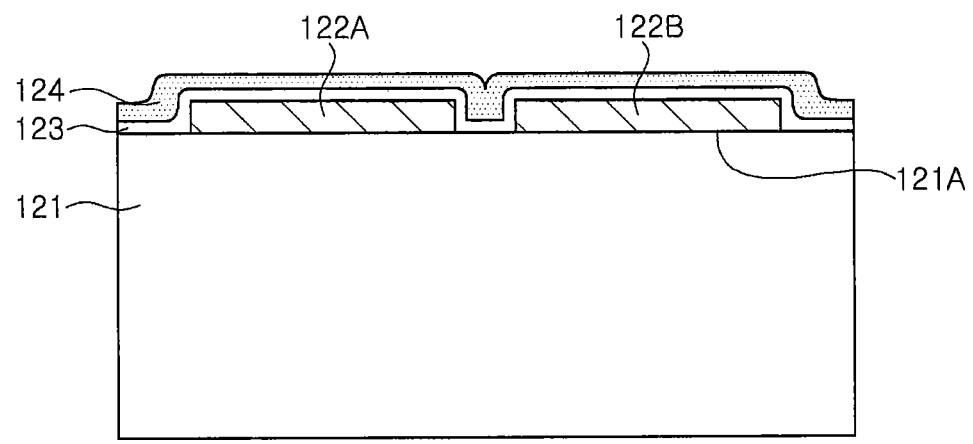
FIGS. 7B, 8B, 8B, and 10B are cross-sectional views taken along line II-II' of the plan views of FIGS. 7A, 8A, 9A, and 10A, respectively.
Figure 8A:
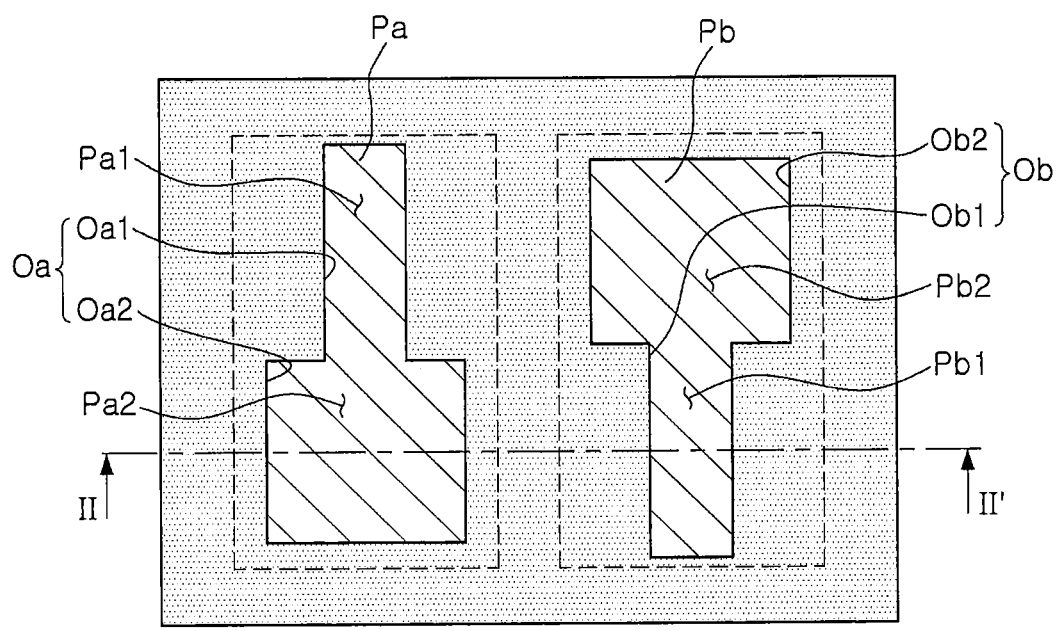
Figure 8B:
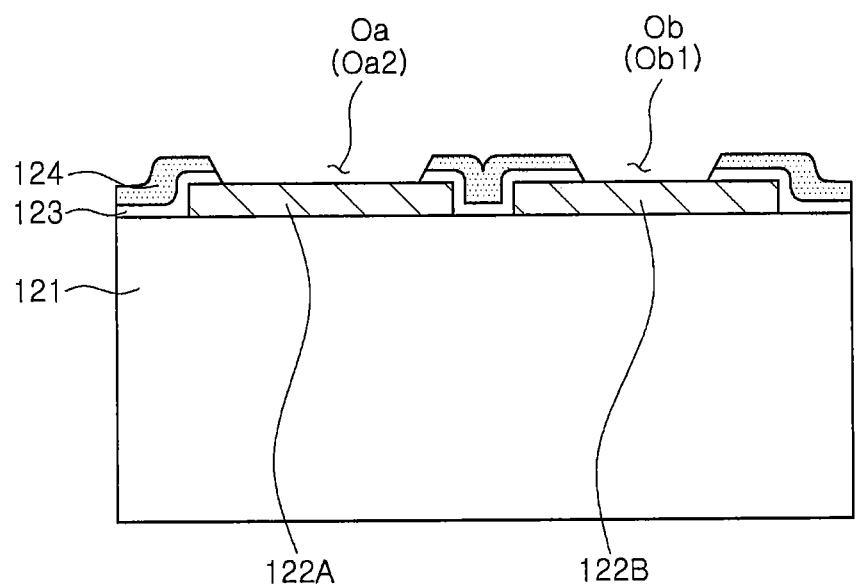
Figure 9A:
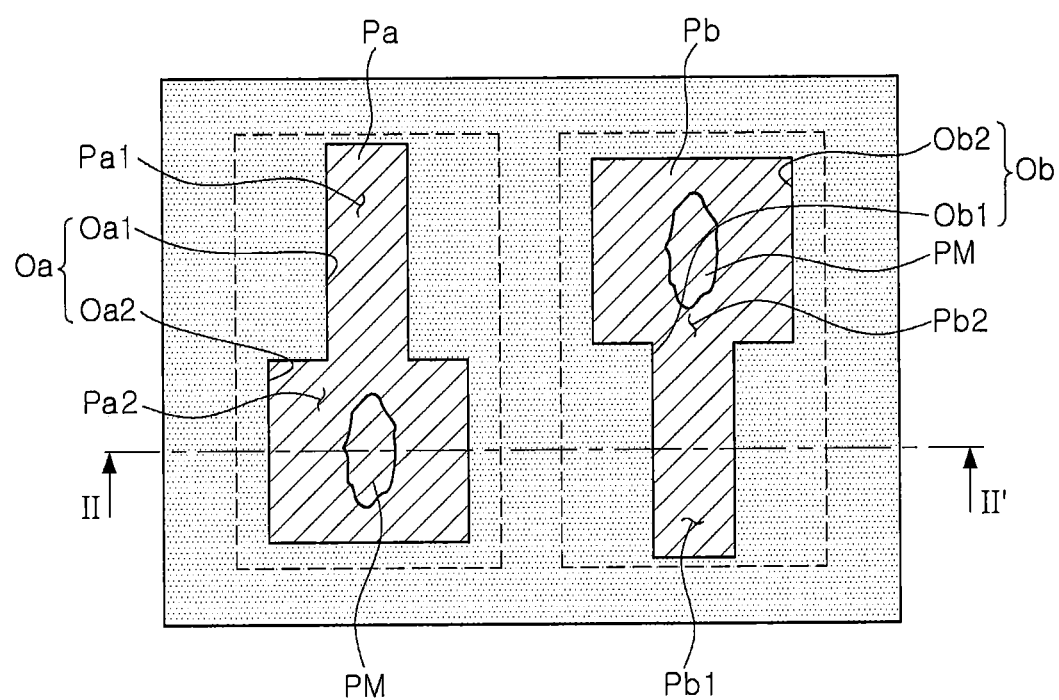
Figure 9B:
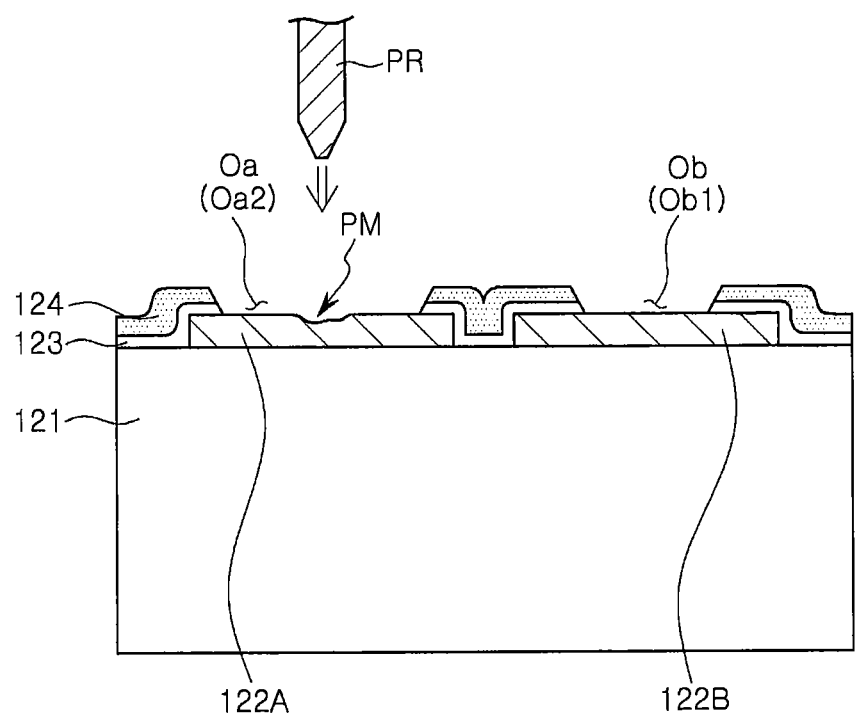
Figure 10A:
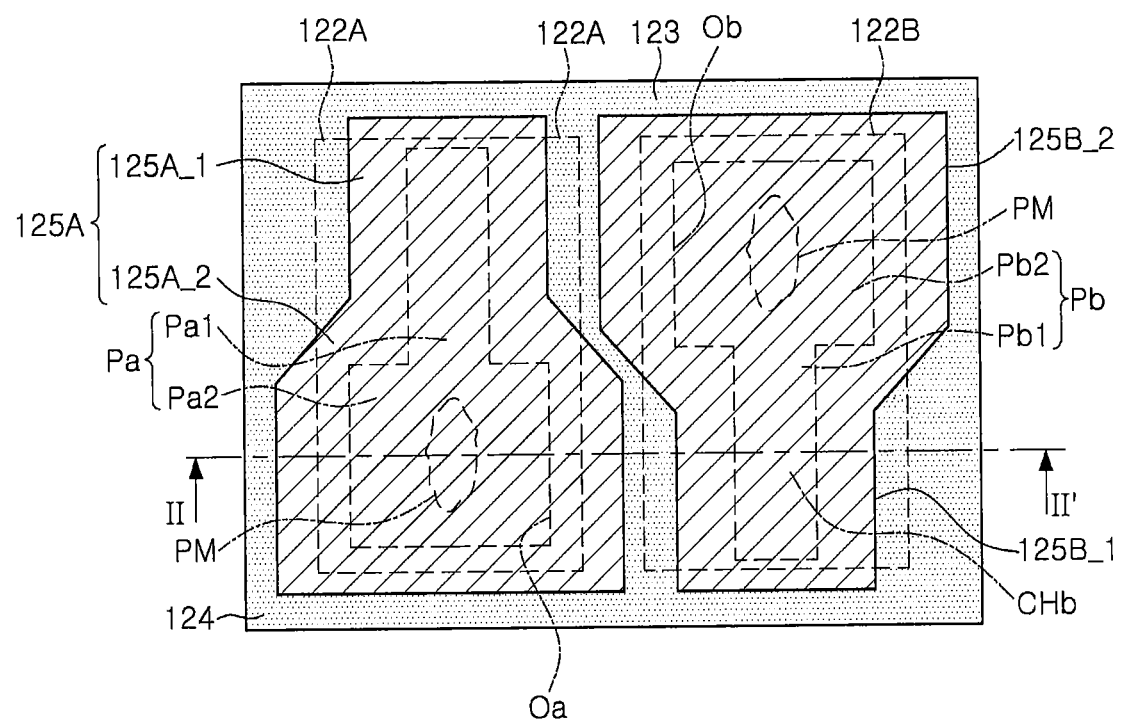

FIGS. 7A, 8A, 9A, and 10A are plan views illustrating a process of manufacturing a bonding structure of a semiconductor chip according to an example embodiment of the present inventive concepts, and FIGS. 7B, 8B, 9B, and 10B are cross-sectional views taken along line II-II' of the plan views of FIGS. 7A, 8A, 8A, and 10A, respectively.

First, referring to FIGS. 7A and 7B, an insulating protective film 123 and an insulating film 124 may be sequentially formed on an active surface 121A of the semiconductor substrate 121.

First and second contact pads 122A and 122B may be disposed on the active surface, and as shown in FIG. 2B, the plurality of first and second contact pads 122A and 122B may be alternately disposed, respectively. As shown in FIG. 7A, the first and second contact pads 122A and 122B may have the same rectangular shape, and may have, for example, a rectangular shape extending in a direction intersecting the arranged direction. For example, the first and second contact pads 122A and 122B may include metal such as aluminum Al.

The insulating protective film 123 may be disposed on the semiconductor substrate 121, and may include, for example, at least one material selected from an oxide, a nitride, and an oxynitride. In a specific example, the insulating protective film 123 may be SiO$_2$/SiN. The insulating film 124 may include an organic material, and in particular, may be a photosensitive organic material. For example, the insulating film 124 may include PSPI.

Subsequently, referring to FIGS. 8A and 8B, first and second openings Oa and Ob exposing some regions of the first and second contact pads 122A and 122B to the insulating protective film 123 and the insulating film 124 may be formed.

A first pad region Pa and a second pad region Pb may be respectively defined by the first and second openings Oa and Ob. Each of the first and second pad regions Pa and Pb may include bonding regions Pa1 and Pb1 having a first width W1, and probing regions area Pa2 and Pb2 having a second width W2, wider than the first width W1 (see, e.g., FIG. 4A). The adjacent first and second pad regions Pa and Pb may be inversely arranged with each other. In this embodiment, the first and second openings Oa and Ob may be arranged such that the bonding regions Pa1 and Pb1 and the probing regions Pb2 and Pa2 face each other in the adjacent first and second pad regions (Pa, Pb). As described above, in the adjacent first and second pad regions Pa and Pb, the probing regions Pa2 and Pb2 having a large area may be disposed to be staggered, thereby securing a probing region having a sufficient area in a limited region.

In the present example embodiment, a form in which openings of the same size are continuously formed in the insulating protective film 123 and the insulating film 124 is illustrated, but after the insulating protective film 123 is formed, openings corresponding to the first and second openings Oa and Ob may be formed, and then after the insulating film 124 is formed, openings in the insulating film 124 overlapping the openings in the insulating protective film 123 may be formed. In this case, the sizes of the openings of the insulating protective film 123 and the insulating film 124 may be different from each other.

Next, referring to FIGS. 9A and 9B, a probe test may be performed on the probing regions Pa2 and Pb2 of each of the first and second pad regions Pa and Pb.

During the probe test process, a probing mark PM may be formed in the probing regions Pa2 and Pb2 of each of the first and second contact pads 122A and 122B by the probe needle PR. As shown in FIG. 9B, the probing mark PM may be provided in a concave structure of the first and second contact pads 122A and 122B. The probing marks PM of the first and second contact pads 122A and 122B may not be arranged side by side in a direction in which the first and second contact pads 122A and 122B are arranged, but may be disposed to be staggered along the probing regions Pa2 and Pb2.

Figure 10B:
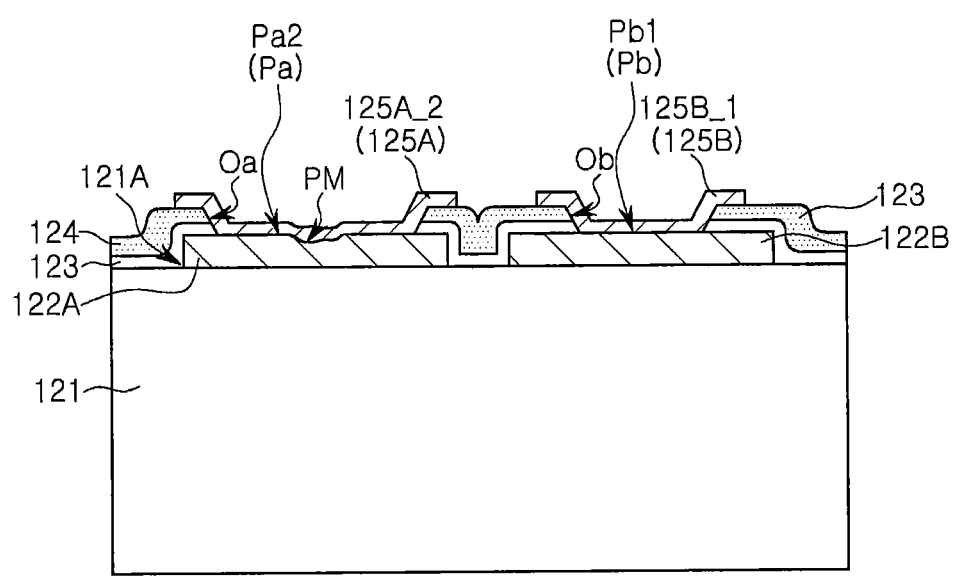

Subsequently, referring to FIGS. 10A and 10B, first and second conductive cap layers 125A and 125B may be formed on the first and second pad regions Pa and Pb, respectively.

The first and second conductive capping layers 125A and 125B may have a shape corresponding to the first and second pad regions Pa and Pb, respectively. Similar to the shape and arrangement of the first and second pad regions Pa and Pb, the first and second conductive capping layers 125A and 125B may have an inversely arranged hammer shape. Specifically, each of the first and second conductive capping layers 125A and 125B may include first regions 125A_1 and 125B_1 having a third width, greater than a first width and second regions 125A_2 and 125B_2 having a fourth width, wider than the third width (see, e.g., FIG. 4A). As shown in FIG. 10A, the second regions 125_A2 and 125_B2 of the adjacent first and second conductive capping layers 125A and 125B may have portions overlapping each other in a second direction (e.g., D2).

The first and second conductive capping layers 125A and 125B may have a portion extending on the insulating film 124. Such an extension portion may compensate for an error due to misalignment of a photoresist pattern for the first and second conductive capping layers 125A and 125B and the first and second openings Oa and Ob.

FIGS. 11A to 11D are cross-sectional views for each main process illustrating a method of manufacturing a semiconductor package according to an example embodiment of the present inventive concepts. As shown in FIGS. 11A to 11D, a process of forming the redistribution structure 140 may be formed at a package level after being singulated to a semiconductor chip.

Figure 11A:
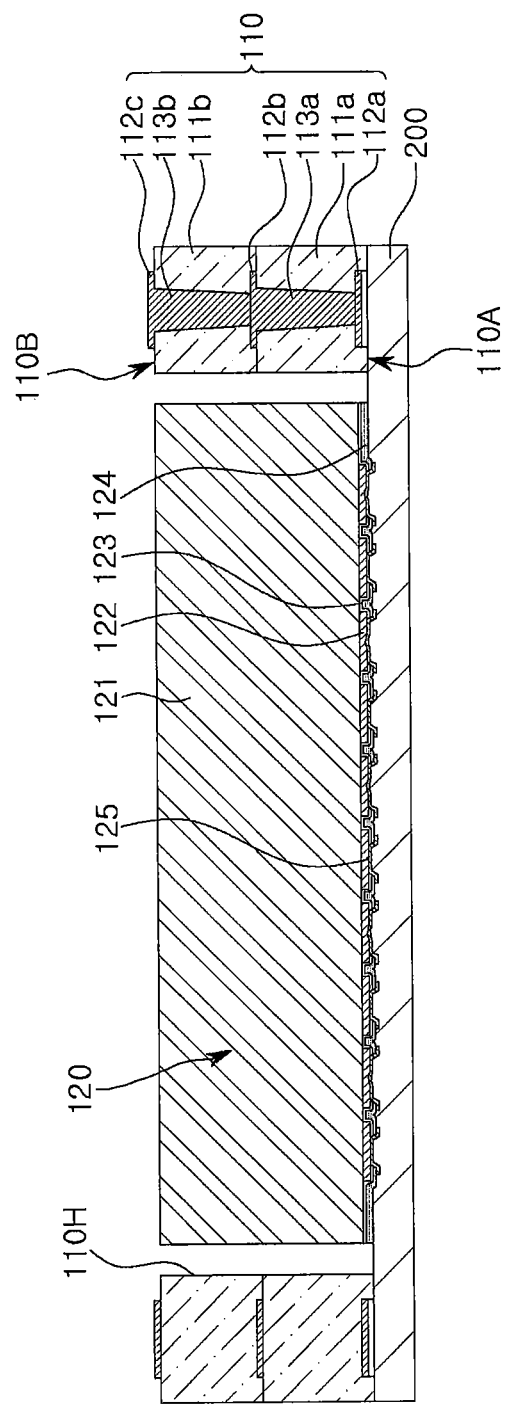
FIGS. 11A to 11D are cross-sectional views illustrating a method of manufacturing a semiconductor package according to an example embodiment of the present inventive concepts.

Referring to FIG. 11A, a support frame 110 having a cavity 110H is attached to a first adhesive film 200, and a semiconductor chip 120 is disposed in the cavity 110H of the support frame 110.

A support frame 110 having first and second surfaces 110A and 110B located opposite to each other and having a cavity 110H penetrating through the first and second surfaces 110A and 110B is provided. Specifically, the support frame 110 may be provided by preparing a carrier film (not shown) on which a metal film is formed and forming a first wiring pattern 112a using the metal film as a seed layer, forming a first insulating layer 111a covering the first wiring pattern 112a on the metal film, forming a second wiring pattern 112b and/or first wiring via 113a on and/or in the first insulating layer 111a, forming a second insulating layer 111b covering the second wiring pattern 112b on the first insulating layer 111a, and forming a third wiring pattern 112c and/or second wiring via 113b on and/or in the second insulating layer 111b. Subsequently, after separating the support frame 110 from the carrier film, a desired support frame 110 may be obtained by removing the metal film remaining on the first wiring pattern 112a. When removing the metal film, a recess portion may be formed in the support frame 110. The first to third wiring patterns 112a, 112b, and 112c may be formed by performing patterning using a dry film, or the like, and then filling the pattern with a known plating process. The first and second insulating layers 111a and 111b may be formed by a known lamination method or coating and curing method. The formation of the cavity 110H may be performed using a laser drill and/or a mechanical drill and/or sand blast.

A first adhesive film 200 may fix the support frame 110. For example, the first adhesive film 200 may include a thermosetting adhesive tape or an ultraviolet curable adhesive tape. A semiconductor chip 120 is attached on the first adhesive film 200 in the cavity 110H. The semiconductor chip 120 is disposed in a face-down manner so that the active surface on which the contact pad 122 is disposed is attached to the first adhesive film 200. As described in FIGS. 10A and 10B, the semiconductor chip 120 may include a conductive capping layer 125 connected to the pad regions of the contact pad 122, and an insulating protective film 123 and an insulating film 124 sequentially disposed on the active surface.

Figure 11B:
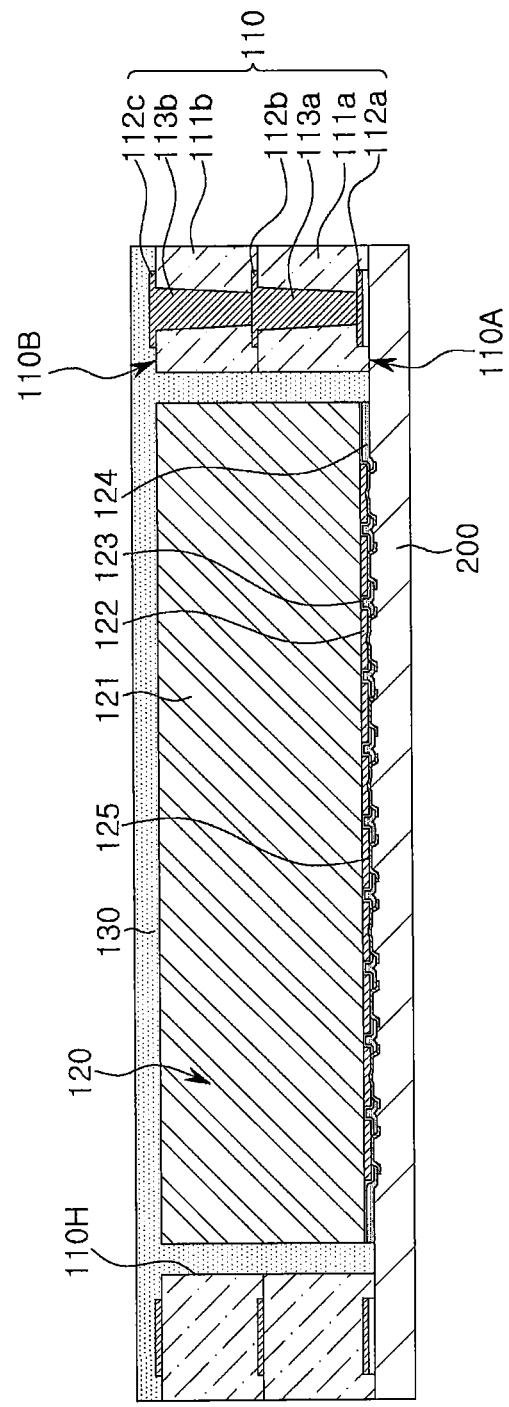

Subsequently, referring to FIG. 11B, the semiconductor chip 120 is sealed using the encapsulant 130.

The encapsulant 130 is disposed to seal the semiconductor chip 120 disposed in the cavity 110H. In the present embodiment, the encapsulant 130 may be on and/or cover the second surface 110B of the support frame 110 and the inactive surface of the semiconductor chip 120, and may fill at least a portion of spaces in the cavity 110H. The encapsulant 130 may be formed by a known method. For example, the encapsulant 130 may be formed by laminating and then curing the precursor. Alternatively, the encapsulant 130 may also be formed by applying a liquid rein for the encapsulant 130 on the first adhesive film 200 to seal the semiconductor chip 120 and then curing it.

Figure 11C:
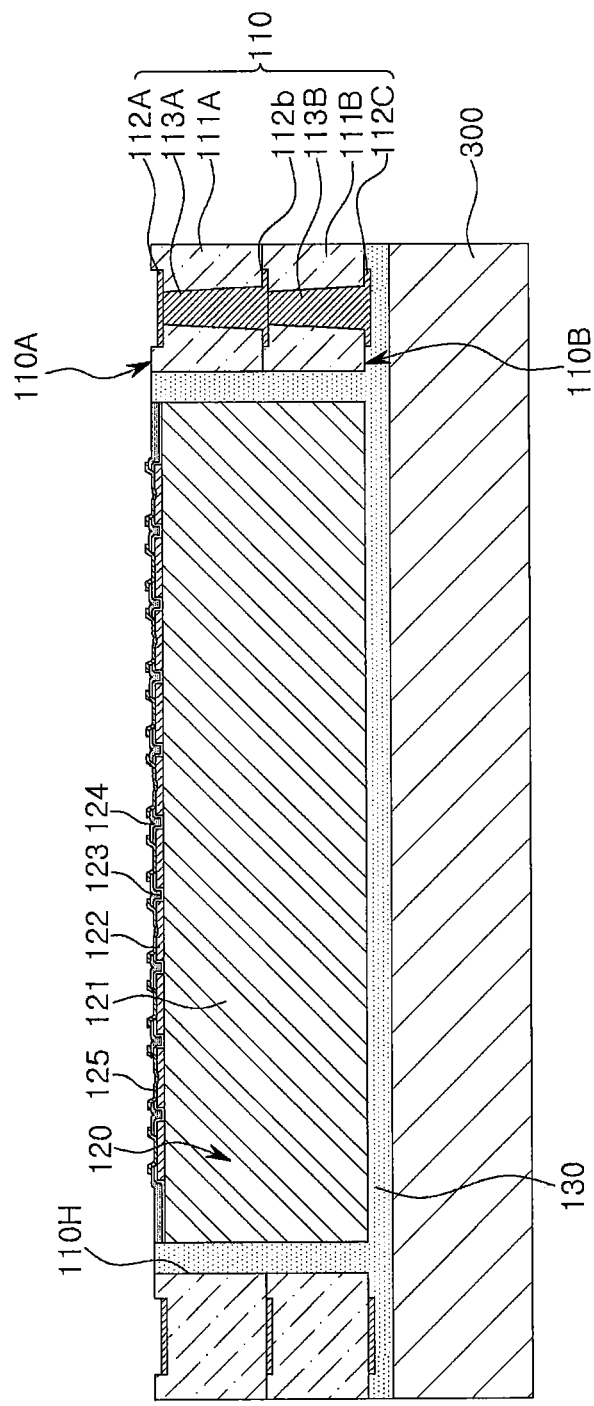

Next, referring to FIG. 11C, the semiconductor chip 120 and the support frame 110 are disposed on a second adhesive film 300 and the first adhesive film 200 is removed to expose the active surface of the semiconductor chip 120.

The second adhesive film 300 may include a material similar to the first adhesive film 200. Depending on the type, the first adhesive film 200 may be peeled off after adhesive strength is weakened by using a heat treatment or irradiation with ultraviolet rays. First and second conductive capping layers 125A and 125B (see FIG. 4A) of conductive capping layer 125 that are respectively connected to the first and second pad regions Pa and Pb may be exposed.

Figure 11D:
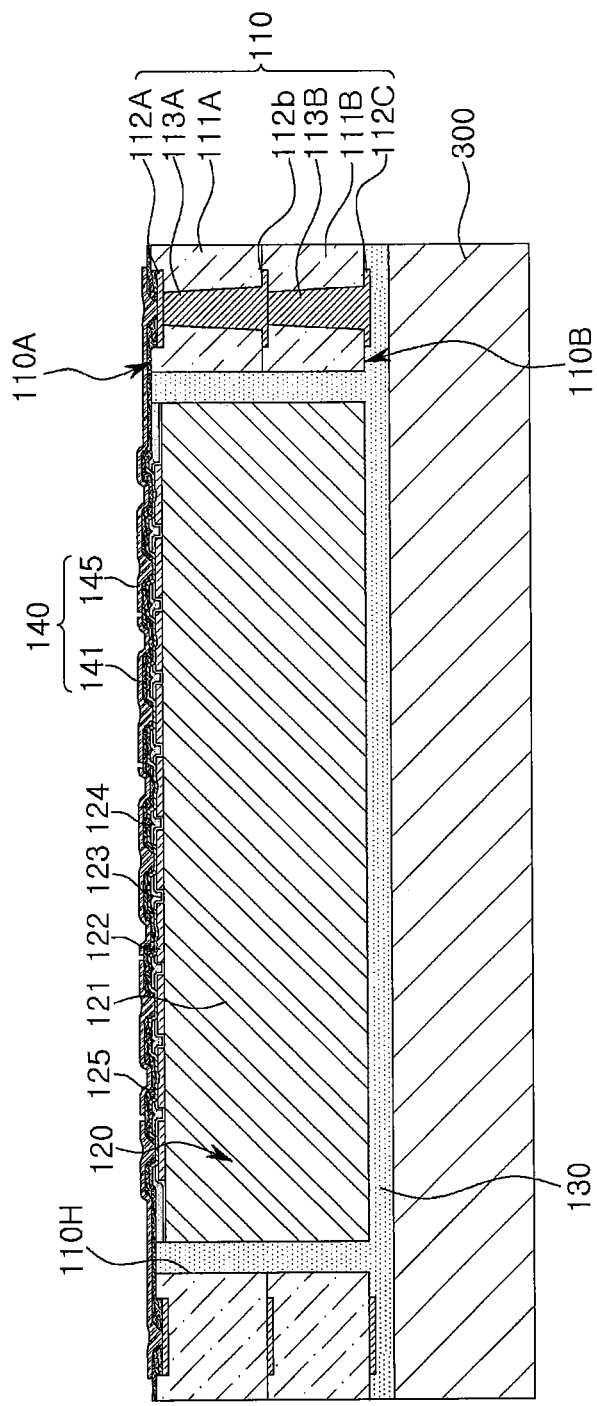
Figure 12A:
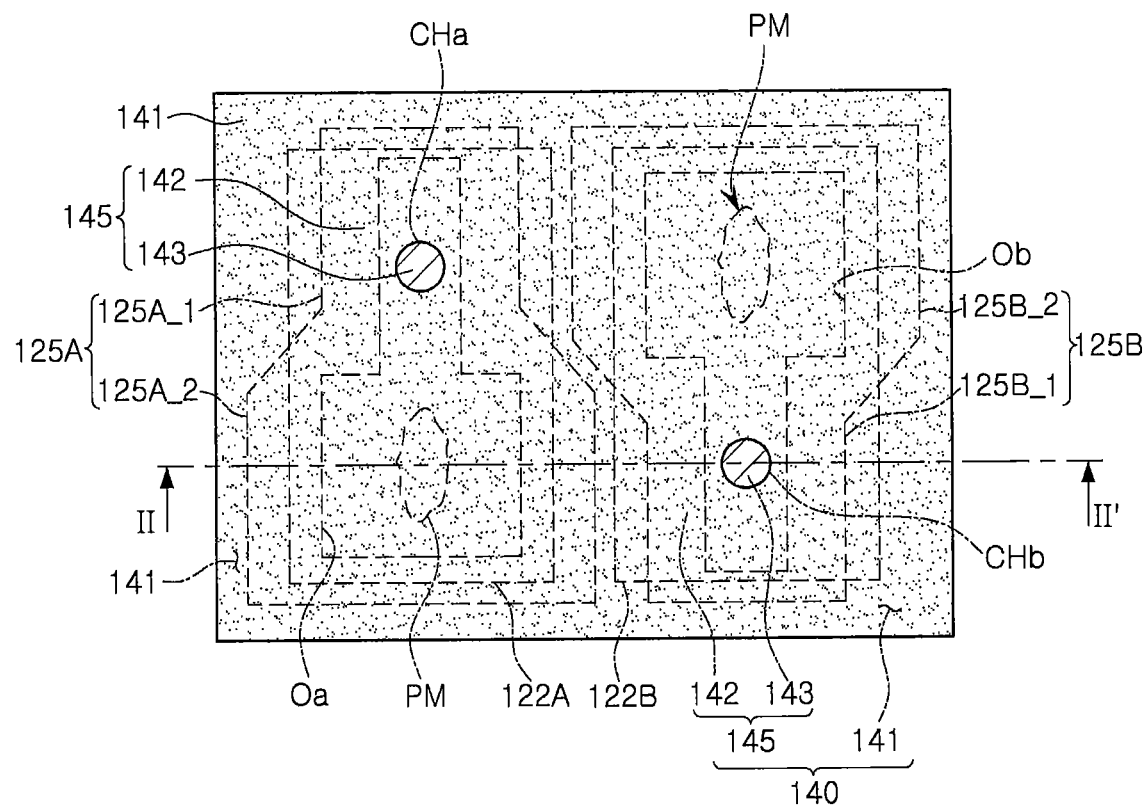
FIGS. 12A and 12B are plan and cross-sectional views, respectively, illustrating a result of the process of FIG. 11D.
Figure 12B:
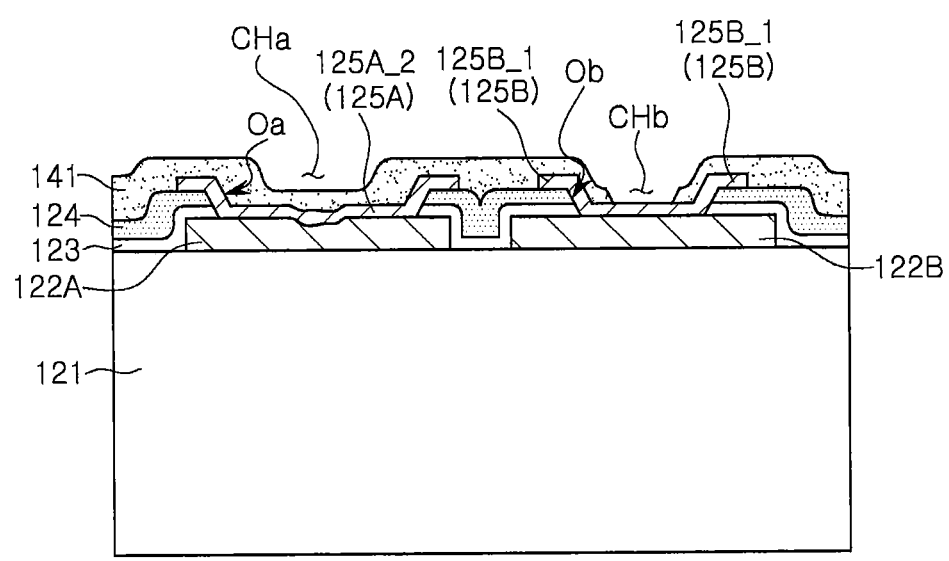

Subsequently, referring to FIG. 11D, a redistribution structure 140 may be formed on the first surface 110A of the support frame 110 from which the second adhesive film 200 has been removed and the active surface of the semiconductor chip 120.

A process of forming the redistribution structure 140 according to the present embodiment may be performed by a photolithography process and a plating process. For example, the insulating layer 141 may include a PID material. As shown in FIGS. 5A, 5B, 12A, and 12B, an insulating layer 141 may be formed on the first surface 110A of the support frame 110 and the active surface of the semiconductor chip 120, and first and second contact holes CHa and CHb respectively connected to first and second conductive capping layers 125A and 125B in the insulating layer 141 using a photolithography process. Subsequently, a redistribution layer 145 may be formed on the insulating layer 141 in a plating process. The redistribution layer 145 may include a redistribution pattern 142 disposed on the insulating layer 141, and redistribution vias 143 respectively connected to the first and second conductive capping layers 125A and 125B through the first and second contact holes CHa and CHb (see FIG. 5A). As described above, since the first and second contact holes CHa and CHb are located in first regions 125A_1 and 125B_1, the redistribution via 143 may be formed in the first regions 125A_1 and 125B_1 where the probe mark PM is not located.

Additionally, referring, for example, to FIGS. 1 to 3, the passivation layer 160 may be formed on the redistribution structure 140, and the UBM layer 180 and the electrical connection structure 190 connected to the redistribution layer 145 may be formed. The passivation layer 160 may be formed by laminating a precursor before curing, or applying a liquid resin before curing. An opening exposing a portion of the redistribution layer 145 of the redistribution structure 140 is formed in the passivation layer 160. A UBM layer 180 is formed on the exposed region of the redistribution layer 145 by a known metallization method, and an electrical connection structure 190 is formed on the UBM layer 180. The above-described processes are performed in units of a large-scale panel, and after the above-described processes are completed, the structure may be singulated into individual semiconductor packages using a sawing process.

FIGS. 13A and 13B are schematic plan and cross-sectional views, respectively, illustrating a semiconductor chip 120A employable in a semiconductor package according to an example embodiment of the present inventive concepts.

The semiconductor chip 120A can be understood as a structure, similar to the example embodiment illustrated in FIGS. 1 to 6, except that the semiconductor chip 120A illustrated in FIGS. 13A and 13B is misaligned with first and second conductive capping layers 125A' and 125B' and first and second openings Oa and Ob. Accordingly, the description of the embodiment shown in FIGS. 1 and 6 may be combined with the description of the present embodiment unless otherwise specified.

In this embodiment, unlike the previous embodiment, the first and second conductive capping layers 125A' and 125B' may not be accurately aligned on the first and second openings Pa and Pb exposed to first and second openings Oa and Ob, and may be misaligned in one direction. A photoresist pattern for the first and second conductive capping layers 125A' and 125B' may be understood as an error generated by misalignment with the first and second openings Oa and Ob.

As a result, an extension portion employed in the present embodiment may have first and second extension portions on both sides of each of the first and second conductive capping layers 125A' and 125B' in a direction (e.g., D1) in which first and second contact pads 122A and 122B are arranged, and a width Wc of the first extension portion may be different from a width Wc' of the second extension portion. As described above, the extension portions of the first and second conductive capping layers 125A' and 125B' may compensate an error due to misalignment not to be exposed without covering the first and second openings Oa and Ob even if misalignment occurs.

Figure 14A:
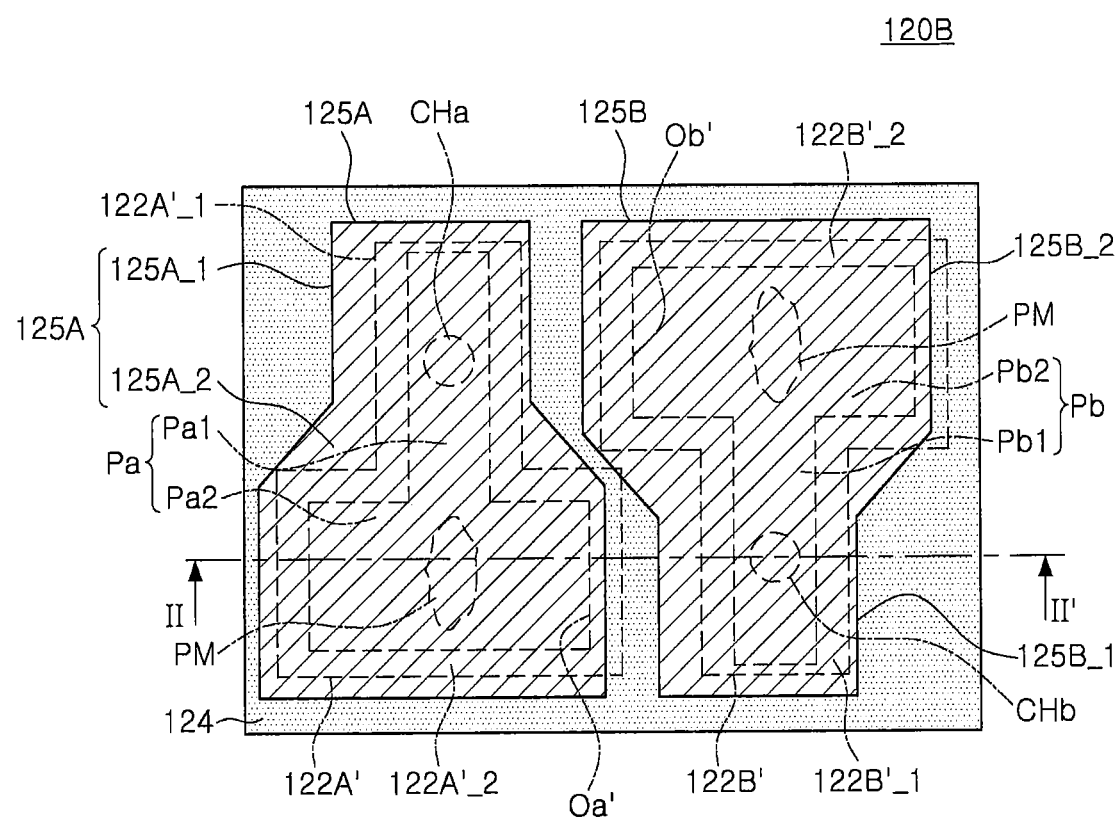
FIGS. 14A and 14B are schematic plan and cross-sectional views, respectively, illustrating a semiconductor chip employable in a semiconductor package according to an example embodiment of the present inventive concepts.
Figure 14B:
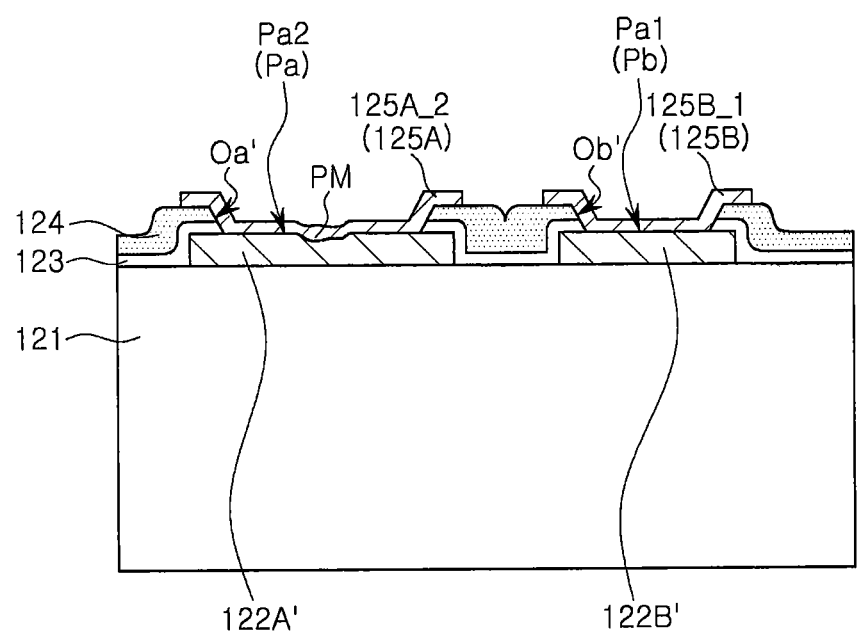

FIGS. 14A and 14B are schematic plan and cross-sectional views, respectively illustrating a semiconductor chip 120B employable in a semiconductor package according to an example embodiment of the present inventive concepts. FIG. 14B is a cross-sectional view taken along line II-II' of FIG. 14A.

It can be understood that the semiconductor chip 120B illustrated in FIGS. 14A and 14B has a similar structure to the example embodiments illustrated in FIGS. 1 to 6, except that first and second contact pads 122A' and 122B' themselves have an inversely-arranged hammer shape. Accordingly, the description of the example embodiment shown in FIGS. 1 and 6 may be combined with the description of the present example embodiment unless otherwise specified.

The semiconductor chip 120B according to the present example embodiment includes first and second contact pads 122A' and 122B' having an inversely-arranged hammer shape. Unlike the previous example embodiment, the shape of the hammer is not defined as the shape of first and second openings Oa and Ob, but the first and second contact pads 122A' and 122B' themselves may be defined to have the shape of the hammer.

Each of the first and second contact pads 122A' and 122B' includes bonding regions 122A'_1 and 122B'_1 having a first width, and probing regions 122A'_2 and 122B'_2 having a second width, wider than the first width, and the first contact pad 122A' may be disposed in order of a bonding region and a probing region in a second direction (e.g., D2) intersecting the first direction (e.g., D1), and he second contact pad 122B' may be disposed in order of a bonding region and a probing region in a direction, opposite to the second direction (e.g., –D).

The first and second openings Oa' and Ob' formed in an insulating protective film 123 and an insulating film 124 may have a shape corresponding to the shape of the first and second contact pads 122A' and 122B', respectively. The first and second openings Oa' and Ob' may also have a hammer shape similar to that of the first and second contact pads 122A' and 122B'. The probing regions 122A' and 122B' of the adjacent first and second contact pads 122A' and 122B' may have portions overlapping each other in a second direction (e.g., D2).

Each of the first and second conductive capping layers 125A and 125B has first regions 125A_1 and 125B_1 having a third width, wider than the first width, and second regions 125A_2 and 125B_2 having a fourth width, wider than the third width. The second regions 125A_2 and 125B_2 of the adjacent first and second conductive capping layers 125A and 125B may also have portions overlapping each other in the second direction. Similar to the previous example embodiments, contact holes CHa and CHb for forming redistribution vias may be located in the first regions 125A_1 and 125B_1 of the first and second conductive capping layers 125A and 125B.

Figure 15:
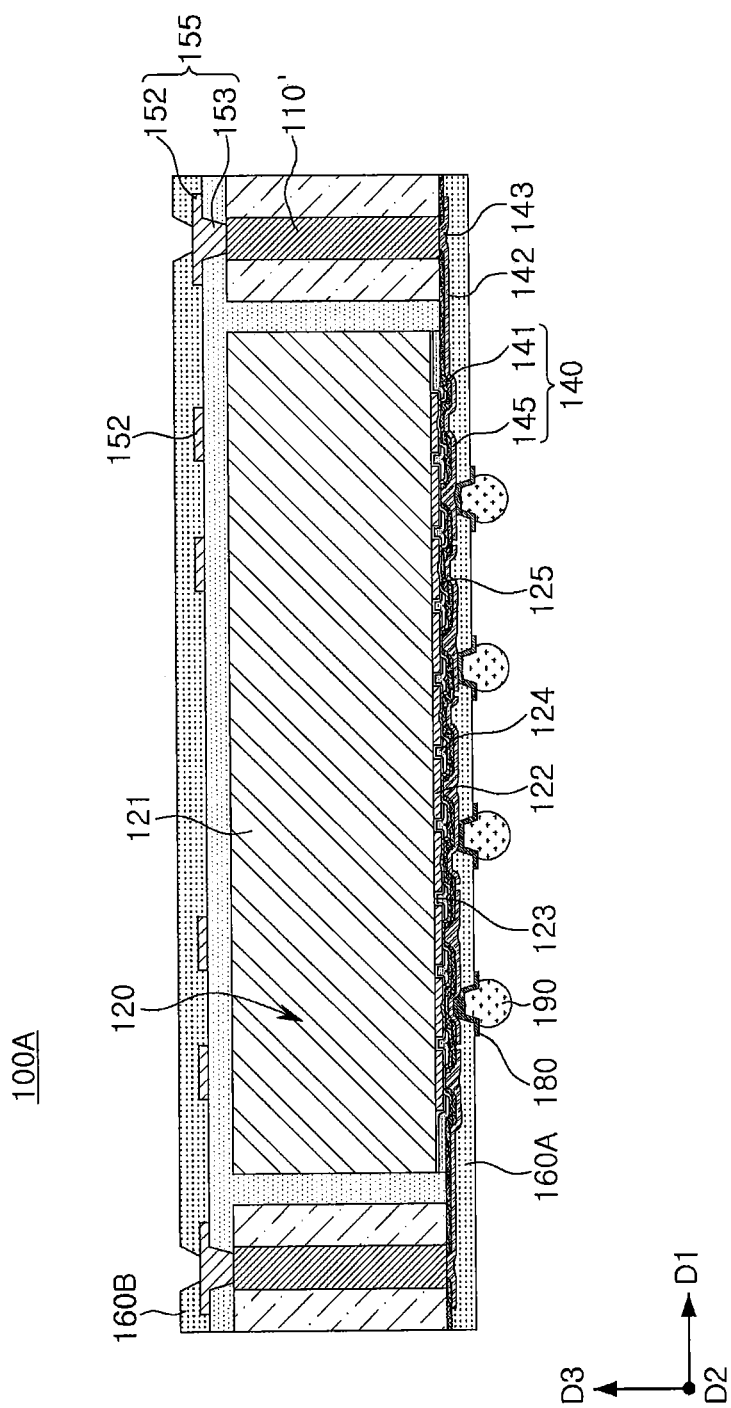
FIG. 15 is a schematic cross-sectional view illustrating a semiconductor package according to an example embodiment of the present inventive concepts.

FIG. 15 is a schematic cross-sectional view illustrating a semiconductor package 100A according to an example embodiment of the present inventive concepts.

Referring to FIG. 15, it can be understood that the semiconductor package 100A according to the present example embodiment has a structure similar to the example embodiments shown in FIGS. 1 to 3, except for having a vertical interconnection portion 110' instead of the frame (110 in FIG. 1) having a wiring structure, and adding a redistribution layer 155 to the encapsulant 130. Accordingly, the description of the embodiment shown in FIGS. 1 to 3 may be combined with the description of the present example embodiment unless otherwise specified.

Unlike the previous example embodiment, the semiconductor package 100A according to the present example embodiment may be a wafer level package. The semiconductor package 100A may include a conductive pillar 110' connecting a second redistribution layer 155 and the first redistribution layer 145 of the redistribution structure 140. A vertical connection conductor such as the conductive pillar 110' may be disposed to penetrate through an encapsulant 130 encapsulating the semiconductor chip 120 to electrically connect the first redistribution layer 145 and the second redistribution layer 155. In the present example embodiment, the conductive pillar 110' is illustrated as being directly connected through the redistribution vias 143 and 153, but is not limited thereto, and may be directly connected by wiring patterns 142 and 152, in other example embodiments.

The semiconductor package 100A may further include an additional redistribution layer 155 (also referred to as a "backside redistribution layer") disposed on the encapsulant 130 and electrically connected to the conductive pillar 110'. The redistribution layer 155 may include a redistribution via 153 and a redistribution pattern 152 connected to the conductive pillar 110'. In a partial region of the redistribution pattern 152, a second passivation layer 160B may be provided as a pad region. The second passivation layer 160B may include a material similar to the first passivation layer 160A. The semiconductor package 100A may be provided in a lower package structure of a package-on-package (POP).

As set forth above, according to an example embodiment, even when a pitch of a contact pad of a semiconductor chip is fine, a method of stably forming a contact hole for a redistribution via while sufficiently securing a probing region may be provided.

The various features, aspect, and effects of inventive concepts may be not limited to the above description, and may be more easily understood in the course of describing a specific embodiment of inventive concepts.

While example embodiments have been illustrated and described above, it will be apparent to those skilled in the art that modifications and variations could be made without departing from the scope of inventive concepts as defined by the appended claims.

What is claimed is:

1. A semiconductor package, comprising:
a semiconductor chip comprising an active surface on which a plurality of first contact pads and a plurality of second contact pads are alternately arranged in a first direction;
an insulating film on the active surface of the semiconductor chip and comprising a plurality of first openings respectively defining first pad regions of the plurality of first contact pads and a plurality of second openings respectively defining second pad regions of the plurality of second contact pads;
a plurality of first and second conductive capping layers on the first and second pad regions, respectively, each of the plurality of first and second conductive capping layers comprising an extension portion extending on the insulating film;
an insulating layer on the insulating film and comprising a plurality of first and second contact holes respectively connected to the plurality of first and second conductive capping layers; and
a redistribution layer on the insulating layer and respectively connected to the plurality of first and second conductive capping layers through the plurality of first and second contact holes,
wherein each of the first and second pad regions comprises a bonding region having a first width and a probing region having a second width, greater than the first width, and wherein each of the first pad regions is arranged in an order of the bonding region and the probing region in a second direction intersecting the first direction, and wherein each of the second pad regions is arranged in an order of the bonding region and the probing region in a direction opposite to the second direction.

2. The semiconductor package of claim 1, wherein each of the plurality of first and second contact pads comprises a same square shape in a plan view.

3. The semiconductor package of claim 2, wherein each of the plurality of first and second contact pads comprises a rectangular shape extending in the second direction.

4. The semiconductor package of claim 1, wherein the first and second pad regions are arranged such that the bonding region and the probing region of two adjacent first and second pad regions face each other in the first direction.

5. The semiconductor package of claim 1, wherein each of the plurality of first and second contact pads comprises a concave probing mark in the probing region.

6. The semiconductor package of claim 1, wherein each of the plurality of first and second contact holes overlaps the bonding region of one of the first or second pad regions.

7. The semiconductor package of claim 1, wherein each of the plurality of first and second conductive capping layers comprises a first region having a third width that is greater than the first width and a second region having a fourth width that is greater than the third width, wherein each of the plurality of first and second conductive capping layers is arranged such that the first region of the first conductive capping layer is adjacent the second region of the second conductive capping layer and the second region of the first conductive capping layer is adjacent the first region of the second conductive capping layer.

8. The semiconductor package of claim 7, wherein second regions of adjacent first and second conductive capping layers among the plurality of first and second conductive capping layers comprise portions overlapping each other in the second direction.

9. The semiconductor package of claim 1, wherein the extension portion has first and second extension portions on opposite sides of each of the plurality of first and second conductive capping layers in the first direction, and wherein a width of the first extension portion is different from a width of the second extension portion.

10. The semiconductor package of claim 1, further comprising an insulating protective film between the active surface of the semiconductor chip and the insulating film.

11. The semiconductor package of claim 1, further comprising an additional insulating layer on the redistribution layer, and an additional redistribution layer connected to the redistribution layer through the additional insulating layer.

12. A semiconductor package, comprising:
a semiconductor chip comprising an active surface; and
a redistribution structure on the active surface of the semiconductor chip,
wherein the semiconductor chip comprises a plurality of first contact pads and a plurality of second contact pads alternately arranged in a first direction on the active surface, an insulating film on the active surface of the semiconductor chip and comprising a plurality of first openings respectively defining first pad regions of the plurality of first contact pads and a plurality of second openings respectively defining second pad regions of the plurality of second contact pads, and a plurality of first and second conductive capping layers on the first and second pad regions, respectively, each of the first and second conductive capping layers comprising an extension portion extending on the insulating film, wherein the redistribution structure comprises an insulating layer on the insulating film and a redistribution layer on the insulating layer, wherein the insulating layer comprises a plurality of first and second contact holes respectively connected to the plurality of first and second conductive capping layers, wherein the redistribution layer is respectively connected to the plurality of first and second conductive capping layers through the plurality of first and second contact holes, wherein each of the first and second pad regions comprises a bonding region having a first width and a probing region having a second width, greater than the first width, wherein each of the first pad regions is arranged in an order of the bonding region and the probing region in a second direction, intersecting the first direction, and wherein each of the second pad regions is arranged in an order of the probing region and the bonding region in the second direction.

13. The semiconductor package of claim 12, wherein the redistribution structure has an area that is larger than the area of the semiconductor chip.

14. The semiconductor package of claim 13, further comprising an encapsulant on the redistribution structure and on the semiconductor chip.

15. The semiconductor package of claim 13, further comprising a support frame on the redistribution structure and surrounding the semiconductor chip.

16. The semiconductor package of claim 15, wherein the support frame has a first surface in contact with the redistribution structure and a second surface located opposite to the first surface, wherein the support frame further comprises a wiring structure connected to the redistribution layer and penetrating through the first surface and the second surface.

17. The semiconductor package of claim 13, further comprising:
an encapsulant on the redistribution structure and on the semiconductor chip; and
a conductive pillar connected to the redistribution layer and penetrating through the encapsulant.

18. A semiconductor package, comprising:
a semiconductor chip comprising an active surface on which a plurality of first contact pads and a plurality of second contact pads are alternately arranged in a first direction;
an insulating film on the active surface of the semiconductor chip and comprising a plurality of first and second openings having a shape respectively corresponding to the plurality of first and second contact pads;
a plurality of first and second conductive capping layers on the plurality of first and second contact pads, respectively, each of the plurality of first and second conductive capping layers comprising a portion extending on the insulating film;
an insulating layer on the insulating film and comprising a plurality of first and second contact holes respectively connected to the plurality of first and second conductive capping layers; and a redistribution layer on the insulating layer and respectively connected to the plurality of first and second conductive capping layers through the plurality of first and second contact holes, wherein each of the plurality of first and second contact pads comprises a bonding region having a first width and a probing region having a second width, greater than the first width, wherein each of the plurality of first and second contact pads is arranged such that the bonding region of the first contact pad is adjacent the probing region of the second contact pad and the bonding region of the second contact pad is adjacent the probing region of the first contact pad.

19. The semiconductor package of claim 18, wherein the probing regions of adjacent ones of the first and second contact pads among the plurality of first and second contact pads overlap each other in the second direction.

20. The semiconductor package of claim 19, wherein each of the plurality of first and second conductive capping layers comprises a first region having a third width that is greater than the first width and a second region having a fourth width that is greater than the third width, and wherein adjacent ones of the first and second conductive capping layers among the plurality of first and second conductive capping layers comprise second regions having overlapping portions in the second direction.

* * * * *